(12) United States Patent
Kagaya et al.

(10) Patent No.: US 7,321,165 B2
(45) Date of Patent: Jan. 22, 2008

(54) SEMICONDUCTOR DEVICE AND ITS MANUFACTURING METHOD

(75) Inventors: Yutaka Kagaya, Hachimori (JP); Keiyo Kusanagi, Akita (JP); Koya Kikuchi, Kawabe (JP); Akihiko Hatasawa, Akita (JP)

(73) Assignee: Elpida Memory, Inc., Tokyo (JP)

( * ) Notice: Subject to any disclaimer, the term of this patent is extended or adjusted under 35 U.S.C. 154(b) by 39 days.

(21) Appl. No.: 10/885,573

(22) Filed: Jul. 8, 2004

(65) Prior Publication Data

US 2005/0077608 A1    Apr. 14, 2005

(30) Foreign Application Priority Data

Aug. 28, 2003    (JP) ............................. 2003-303974

(51) Int. Cl.
*H01L 23/48*    (2006.01)
*H01L 23/52*    (2006.01)

(52) U.S. Cl. ...................... 257/692; 257/691; 257/686; 257/E23.01; 257/E23.06; 257/E21.511

(58) Field of Classification Search ................ 257/686, 257/691, 692, E23.01, E23.06, E21.511; 438/109
See application file for complete search history.

(56) References Cited

U.S. PATENT DOCUMENTS

| | | | | |
|---|---|---|---|---|
| 4,814,855 A | * | 3/1989 | Hodgson et al. ............ 174/558 |
| 5,252,854 A | * | 10/1993 | Arita et al. .................. 257/676 |
| 5,594,275 A | * | 1/1997 | Kwon et al. ................. 257/686 |
| 6,307,256 B1 | * | 10/2001 | Chiang et al. ............... 257/668 |
| 6,518,659 B1 | * | 2/2003 | Glenn .......................... 257/704 |
| 6,670,702 B2 | * | 12/2003 | Corisis et al. .............. 257/686 |
| 6,781,241 B2 | * | 8/2004 | Nishimura et al. .......... 257/777 |
| 2003/0111722 A1 | * | 6/2003 | Nakao ......................... 257/686 |
| 2004/0106190 A1 | * | 6/2004 | Yang et al. ............... 435/287.2 |
| 2004/0255451 A1 | * | 12/2004 | Azcarate et al. ........... 29/566.3 |
| 2005/0010725 A1 | * | 1/2005 | Eilert .......................... 711/132 |

FOREIGN PATENT DOCUMENTS

| | | |
|---|---|---|
| JP | 01-191462 | 2/1988 |
| JP | 02-198148 | 1/1989 |
| JP | 05-090723 | 9/1991 |
| JP | 09-275252 | 4/1996 |

* cited by examiner

*Primary Examiner*—Michelle Estrada
(74) *Attorney, Agent, or Firm*—Mattingly, Stranger, Malur & Brundidge, PC

(57) ABSTRACT

In a semiconductor device in which a plurality of substrates each mounting a semiconductor chip are stacked, one ends of the leads formed on the substrates are connected to the semiconductor chip and the other ends thereof are connected to connection terminals of the substrates. At least one of the leads are branched into two or more in the vicinity of the connection terminals, and one ends of the branched leads are connected to the connection terminals. A technique for sorting good products is performed in a state in which the chips are mounted on the substrates.

15 Claims, 26 Drawing Sheets

FIG. 8

| Connection signals before trimming (Common specifications) | Select signal by trimming | | | |
|---|---|---|---|---|
| | Package 1 | Package 2 | Package 3 | Package 4 |
| DQ0,8,16,24 | DQ0 | DQ8 | DQ16 | DQ24 |
| DQ1,9,17,25 | DQ1 | DQ9 | DQ17 | DQ25 |
| DQ2,10,18,26 | DQ2 | DQ10 | DQ18 | DQ26 |
| DQ3,11,19,27 | DQ3 | DQ11 | DQ19 | DQ27 |
| DQ4,12,20,28 | DQ4 | DQ12 | DQ20 | DQ28 |
| DQ5,13,21,29 | DQ5 | DQ13 | DQ21 | DQ29 |
| DQ6,14,22,30, | DQ6 | DQ14 | DQ22 | DQ30 |
| DQ7,15,23,31, | DQ7 | DQ15 | DQ23 | DQ31 |
| DM0,1,2,3 | DM0 | DM1 | DM2 | DM3 |
| VSSL,VSSU | VSSL | VSSU | VSSU | VSSL |
| VSSQL,VSSQU | VSSQL | VSSQU | VSSQU | VSSQL |
| VDDL,VDDU | VDDL | VDDU | VDDU | VDDL |
| VDDQL,VDDQU | VDDQL | VDDQU | VDDQU | VDDQL |

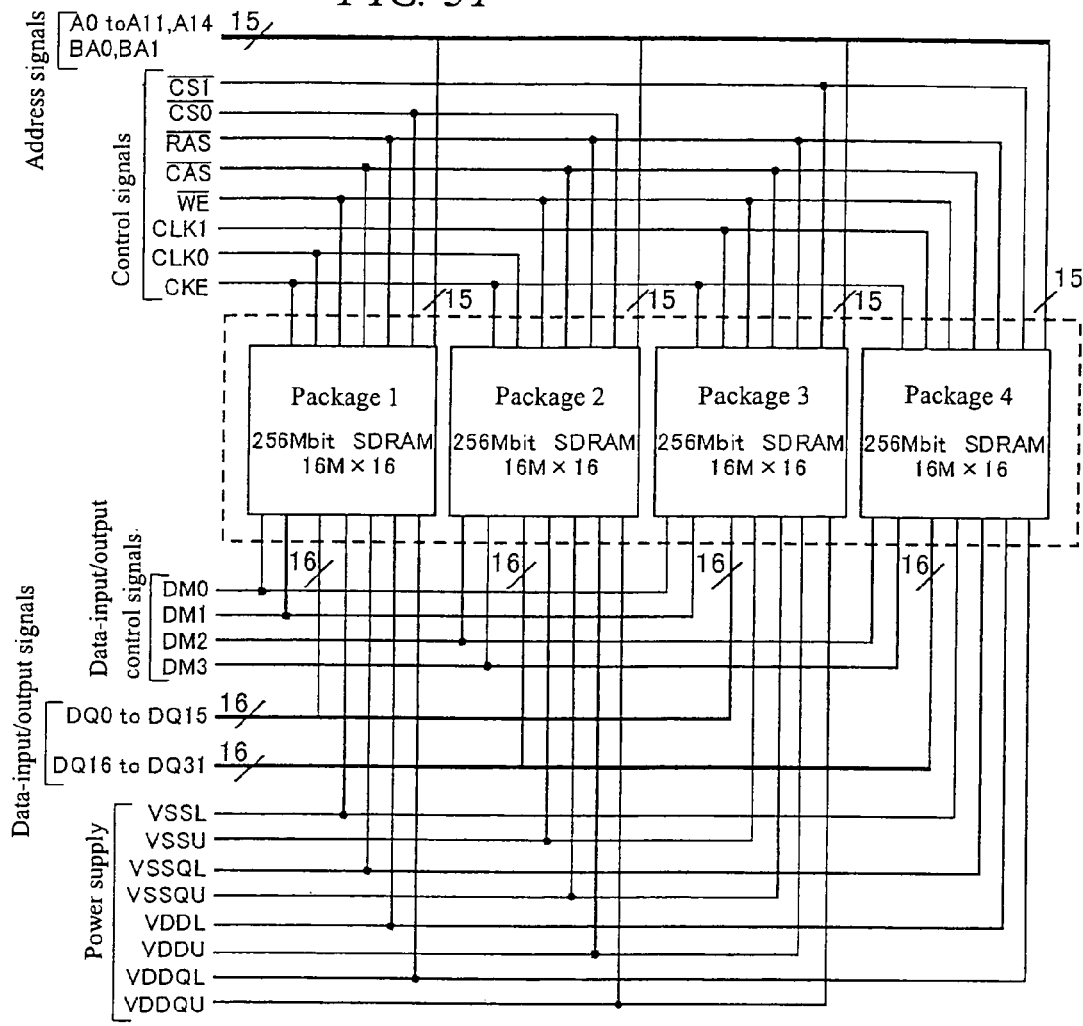

FIG. 32

| Connection signals before trimming (Common specifications). | Select signal by trimming | | | |
|---|---|---|---|---|
| | Package 1 | Package 2 | Package 3 | Package 4 |
| CS0,1 | CS0 | CS0 | CS1 | CS1 |
| CLK0,1 | CLK0 | CLK0 | CLK1 | CLK1 |
| DQ0,16 | DQ0 | DQ16 | DQ0 | DQ16 |
| DQ1,17 | DQ1 | DQ17 | DQ1 | DQ17 |
| DQ2,18 | DQ2 | DQ18 | DQ2 | DQ18 |
| DQ3,19 | DQ3 | DQ19 | DQ3 | DQ19 |
| DQ4,20 | DQ4 | DQ20 | DQ4 | DQ20 |
| DQ5,21 | DQ5 | DQ21 | DQ5 | DQ21 |
| DQ6,22 | DQ6 | DQ22 | DQ6 | DQ22 |
| DQ7,23 | DQ7 | DQ23 | DQ7 | DQ23 |
| DQ8,24 | DQ8 | DQ24 | DQ8 | DQ24 |
| DQ9,25 | DQ9 | DQ25 | DQ9 | DQ25 |
| DQ10,26 | DQ10 | DQ26 | DQ10 | DQ26 |
| DQ11,27 | DQ11 | DQ27 | DQ11 | DQ27 |
| DQ12,28 | DQ12 | DQ28 | DQ12 | DQ28 |
| DQ13,29 | DQ13 | DQ29 | DQ13 | DQ29 |
| DQ14,30, | DQ14 | DQ30 | DQ14 | DQ30 |
| DQ15,31 | DQ15 | DQ31 | DQ15 | DQ31 |
| DM0,2 | DM0 | DM2 | DM0 | DM2 |
| DM1,3 | DM1 | DM3 | DM1 | DM3 |
| VSSL,VSSU | VSSL | VSSU | VSSU | VSSL |
| VSSQL,VSSQU | VSSQL | VSSQU | VSSQU | VSSQL |
| VDDL,VDDU | VDDL | VDDU | VDDU | VDDL |
| VDDQL,VDDQU | VDDQL | VDDQU | VDDQU | VDDQL |

SEMICONDUCTOR DEVICE AND ITS MANUFACTURING METHOD

CROSS-REFERENCE TO RELATED APPLICATION

The present application claims priority from Japanese patent application No. JP 2003-303974 filed on Aug. 28, 2003, the content of which is hereby incorporated by reference into this application.

BACKGROUND OF THE INVENTION

The present invention relates to a semiconductor device and its manufacturing method. More particularly, the present invention relates to a technique effectively applied to a semiconductor device in which substrates each mounting a semiconductor chip are stacked.

In the manufacture of a semiconductor device, semiconductor elements or line patterns are collectively formed in a plurality of element forming regions provided in a wafer made of single crystal silicon etc. so as to form a predetermined circuit; and the wafer is trimmed along a scribing region between the adjacent element forming regions and there is performed dicing by which the respective element forming regions are separated as individual semiconductor chips. Thereafter, through an assembly process such as a bonding process for fixing the separated individual semiconductor chips to a base substrate and an encapsulation process such as resin encapsulation, the manufacture of a semiconductor device is completed.

For example, in a semiconductor memory device such as a DRAM, larger memory capacity or a space-saving semiconductor memory device with predetermined memory capacity has been demanded. In order to meet such a demand, there has been invented an SIP (System In Package) in which a plurality of semiconductor chips are encapsulated in a single encapsulation body. In this SIP, since a plurality of semiconductor chips to be used must be all good (non-defective) chips KGD (Known Good Dic) and a technique for sorting good products in bare chips has not been sufficiently established, there has been invented such a method that sorting testing of the semiconductor chip is carried out in a state of being attached to a substrate and only the substrates to each of which a good semiconductor hip in attached are stacked.

The substrate as mentioned above is composed of an insulating substrate made of polyimide etc. on which leads each made of a metal film are formed, and one ends of the leads are connected to pads of the semiconductor chip and the other ends of the leads are connected to connection terminals of the substrate. The bump electrodes formed on the connection terminals are used to connect each of the substrates. The semiconductor chip in fixed to the substrate by an adhesive layer, and the connecting portions between the leads and the pads are covered with an encapsulation material such as a resin.

In the case of connecting each of the semiconductor chips thus stacked and assembled, the terminals common to the respective semiconductor chips such as address lines among the terminals of the semiconductor chips can be connected in parallel by using the same line patterns. However, an individual line must be prepared for the terminal specific to each semiconductor chip, and the substrates each having different line patterns must be prepared for each layer.

Therefore, Japanese Patent Laid-Open No. 2-198148 (Japanese Patent No. 2695893) discloses a technique for providing a plurality of leads connected to the semiconductor chip and selecting a proper lead from the leads.

SUMMARY OF THE INVENTION

However, since scaling down of the semiconductor chip has been advanced in recent years, it is in many cases difficult to ensure a space for arranging a plurality of leads in connecting portions of the semiconductor chip. With the capacity increase owing to the further scaling down of the semiconductor device, circuit configuration becomes more and more complicated and diversified. Therefore, in performing the stack assembly, the number of signals requiring individually the lines has been increasing.

FIGS. 1 to 4 are plan views showing tape carrier substrates for each layer used in performing the stack assembly, which is the prior art preliminarily examined by the inventors of this invention. In this case, the four types of tape carrier substrates 1 each having different patterns are prepared as shown in FIGS. 1 to 4. The manufacturing process of a semiconductor device using these tape carrier substrates shown in FIGS. 1 to 4 will be described with reference to a flow diagram in FIG. 5.

First, after performing a BGA assembly for mounting a semiconductor chip on each of the tape carrier substrates "A", "B", "C", and "D" for each layer, Burn In (B/I) testing and sorting testing of the tape carrier substrates 1 for each layer are carried out to sort the good products.

For example, since the arrangement of pins differs at the time of these testings, it is necessary to change the programs of the individual layer with respect to each of the tape carrier substrates 1 (A, B, C, and D) for different layers. Therefore, the testing becomes complicated and the time required for the testing is increased.

Then, as for the sorted good products, since the tape carrier substrates 1 are singulated for each of the patterns (A, B, C, and D) before the testing, there is a possibility that the number of the tape carrier substrates 1 for a specific layer, in which numerous defect occurs depending on results of sorting the good products, will be lack. Consequently, there has arisen the case where the tape carrier substrates 1 for other layers cannot be efficiently used.

The sorted tape carrier substrates 1 are stacked in predetermined order and then assembled on each other by heating and melting the bump electrodes 6. Thereafter, the sorting testing for the whole semiconductor device is carried out to eliminate the defective products, and then the semiconductor device as a product is completed.

An object of the present invention is to provide a technique capable of coping with the increase in the number of signals and using in common the substrates for performing the stack assembly of the semiconductor chips.

The above and other objects and novel characteristics of the present invention will be apparent from the description of this specification and the accompanying drawings.

The typical ones of the inventions disclosed in this application will be briefly described as follows.

A semiconductor device, in which a plurality of substrates each mounting a semiconductor chip are stacked, comprises: said substrate having a plurality of leads and a plurality of connection terminals; respective one ends of said plurality or leads, which are connected to said semiconductor chip; the respective other ends of said plurality of leads, which are connected to the plurality of connection terminals of each of said substrates; at least one of said plurality of leads, which is branched in the vicinity of said connection terminals; and one of said branched leads, which is connected to said connection terminals.

Also, a manufacturing method of a semiconductor device in which a plurality of substrates each mounted on a semiconductor chip are stacked comprises the steps of: preparing a substrate having a plurality of leads, a plurality of connection terminals connected to the plurality of leads, and branched leads branched in the vicinity of said connection terminals in at least one of said plurality of leads: mounting the semiconductor chip on said substrates and connecting one ends of said plurality of leads to said semiconductor chip; sorting good products in a state of mounting the semiconductor chip on said substrates; leaving a predetermined lead of said branched leads and trimming other leads; and stacking the substrates whose branched leads are trimmed.

Also, the manufacturing method of a semiconductor device further comprises the stop of; providing a window for trimming said leads in the vicinity of the connection terminals and trimming, at the window, other branched leads except the predetermined lead of said branched leads.

Also, in the manufacturing method of the semiconductor device, trimming of the leads at said window is carried out using a laser.

Effects obtained by representative one of inventions disclosed in thin application will be briefly described as follows.

(1) According to the present invention, the tape carrier substrates having the same pattern can be used as the tape carrier substrates for each layer in the stack assembly, by selectively trimming the leads branched in the vicinity of the connection terminals to change the circuit pattern.

(2) According to the present invention, by effect (1) described above, since the switching of the signals is carried out in the vicinity of the connection terminal of the tape carrier substrate, a sufficient space is provided in the tape carrier substrate and a large number of signals can be switched.

(3) According to the present invention, since the window is provided at the location at which the leads are to be trimmed in the tape carrier substrate, it is possible to easily and surely trim the leads.

(4) According to the present invention, by effect (1) described above, since the same lead patterns are formed on the tape carrier substrates, all of the tape carrier substrates can be tested by setting the same testing, whereby it is possible to simplify the testing and reduce the time required for the testing.

(5) According to the present invention, by effect (1) described above, it is possible to easily cope with the increases of the number and kind of signals to be selected.

(6) According to the present invention, by effect (4) described above, since the tape carrier substrates for each layer are singulated with respect to the sorted good products, it in possible to prevent lack of the number of tape carrier substrates for each layer and to efficiently use the tape carrier substrates.

(7) According to the present invention, since the switching of the signals is carried out in the vicinity of the connection terminals of the tape carrier substrate, a sufficient space is provided in the tape carrier substrate and a large number of signals can be switched. Also, since the leads can be easily and surely trimmed and all of the tape carrier substrates can be trimmed by setting the same testing, it is possible to simplify the testing and reduce the time required for the testing.

BRIEF DESCRIPTION OF THE DRAWINGS

FIG. 8 is a table showing signals selected by trimming per package of the semiconductor chips.

FIG. 31 is a block diagram showing a modified example of the semiconductor device according to an embodiment of the present invention.

FIG. 32 is a table showing signals selected by trimming per package of the semiconductor chips.

DESCRIPTION OF THE PREFERRED EMBODIMENTS

Hereinafter, embodiments of the present invention will be described.

Note that components having the same function are denoted by the same reference symbol throughout all the drawings for describing the embodiments and the repetitive description thereof will be omitted.

(First Embodiment)

Figure 1:
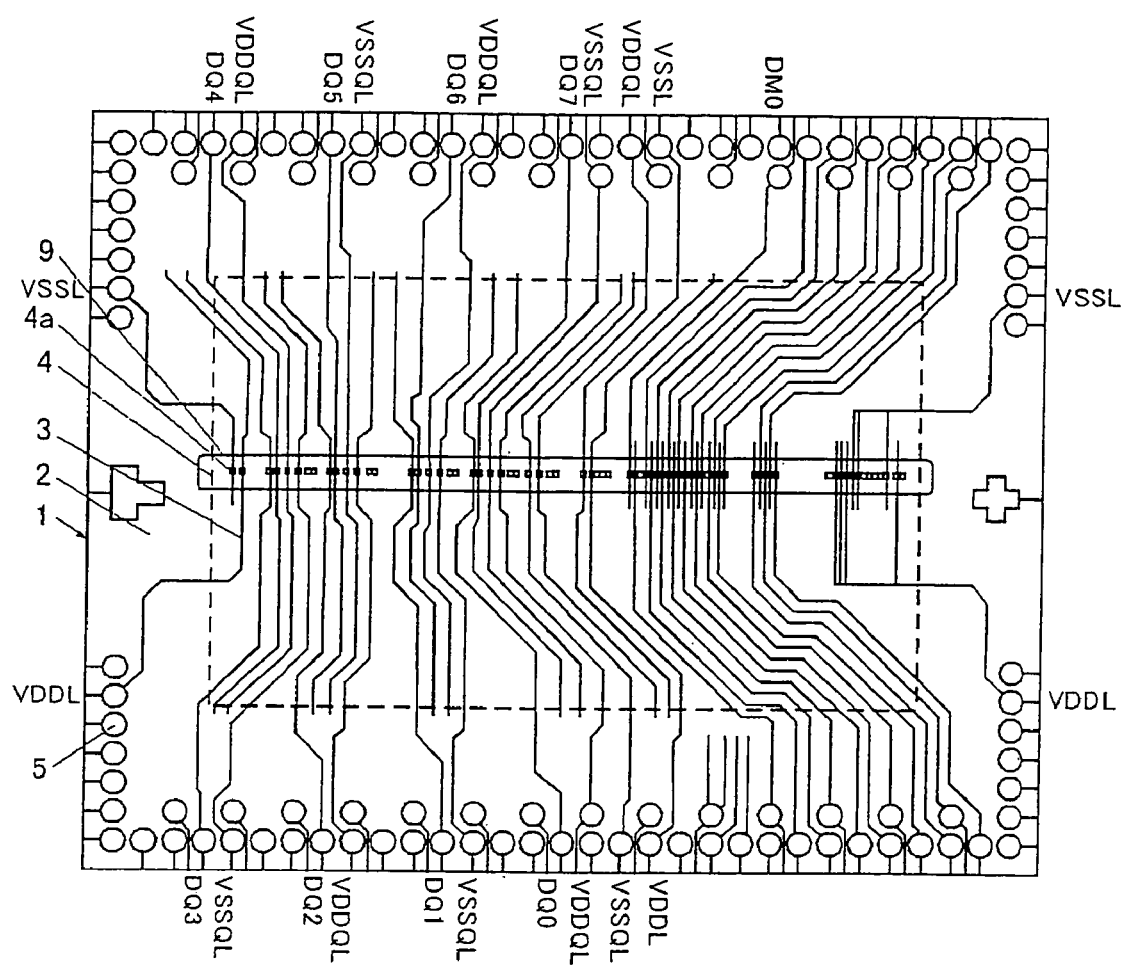
FIG. 1 is a plan view showing a tape carrier substrate for each layer in a stack assembly preliminarily examined by the inventors of the present invention.
Figure 2:
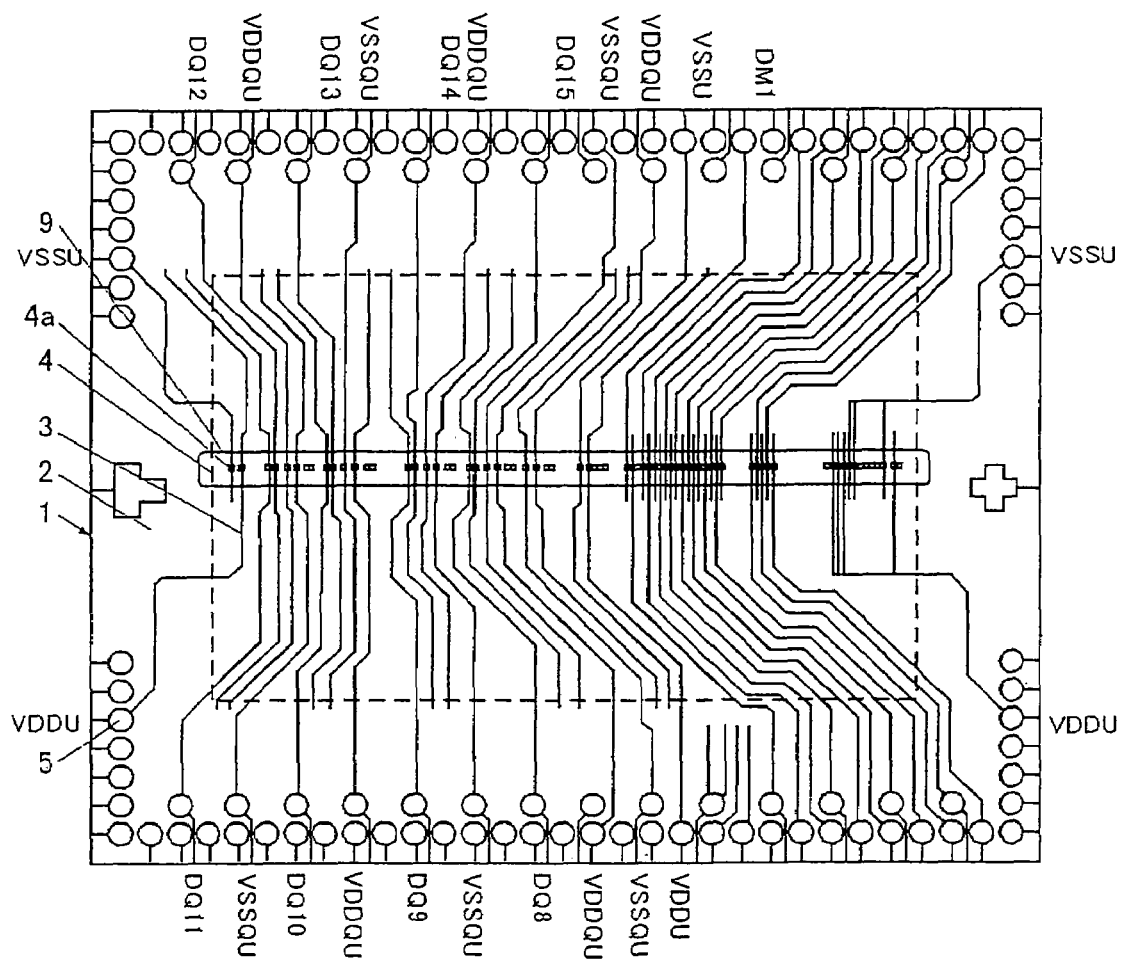
FIG. 2 is a plan view showing a tape carrier substrate for each layer in a stack assembly preliminarily examined by the inventors of the present invention.
Figure 3:
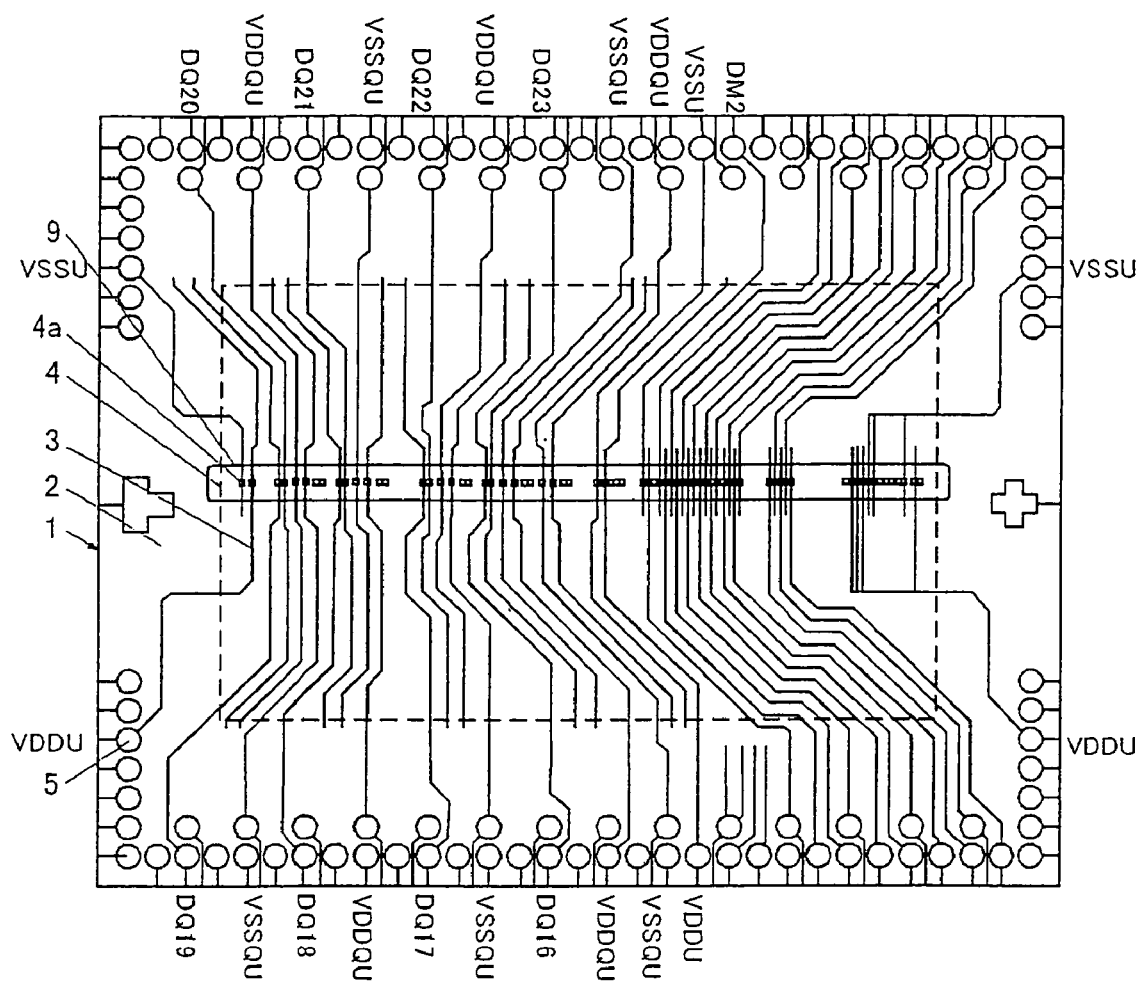
FIG. 3 is a plan view showing a tape carrier substrate for each layer in a stack assembly preliminarily examined by the inventors of the present invention.
Figure 4:
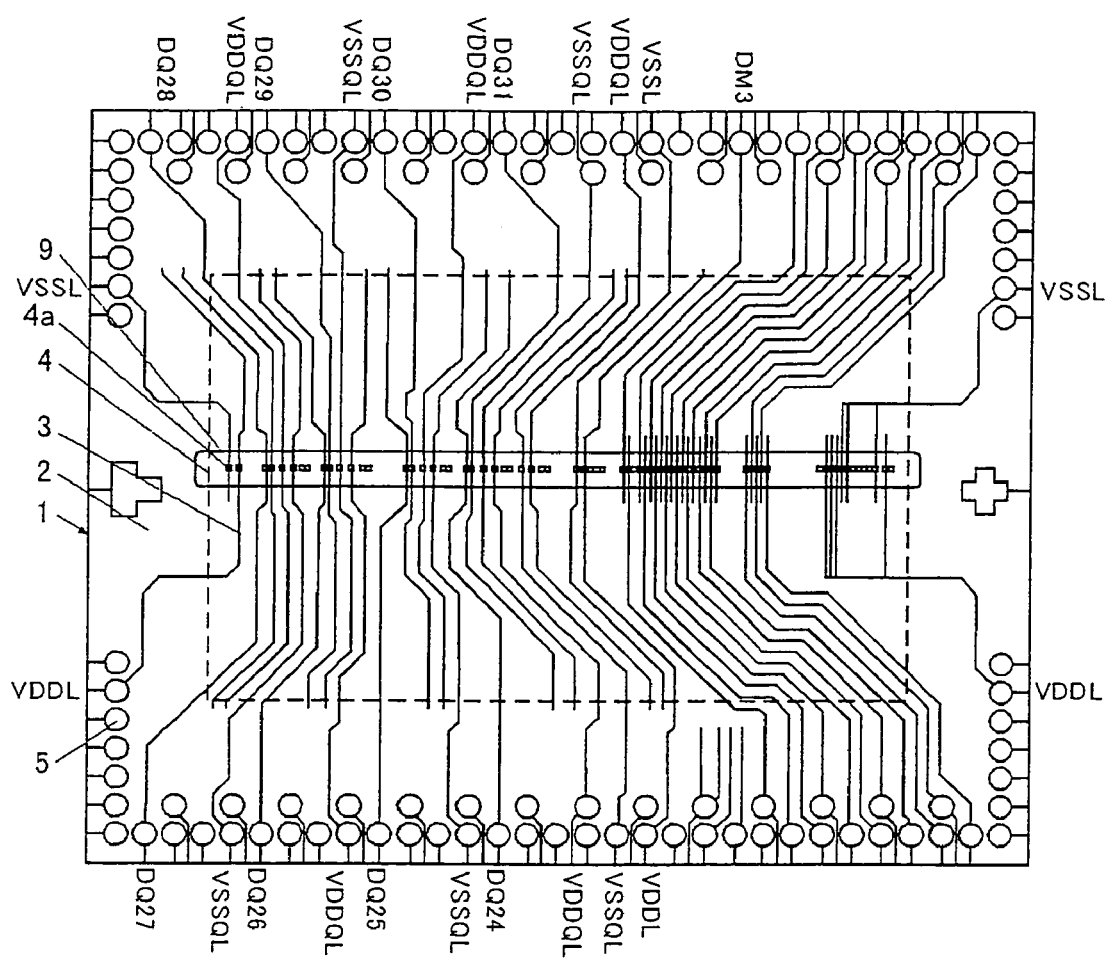
FIG. 4 is a plan view showing a tape carrier substrate for each layer in a stack assembly preliminarily examined by the inventors of the present invention.
Figure 5:
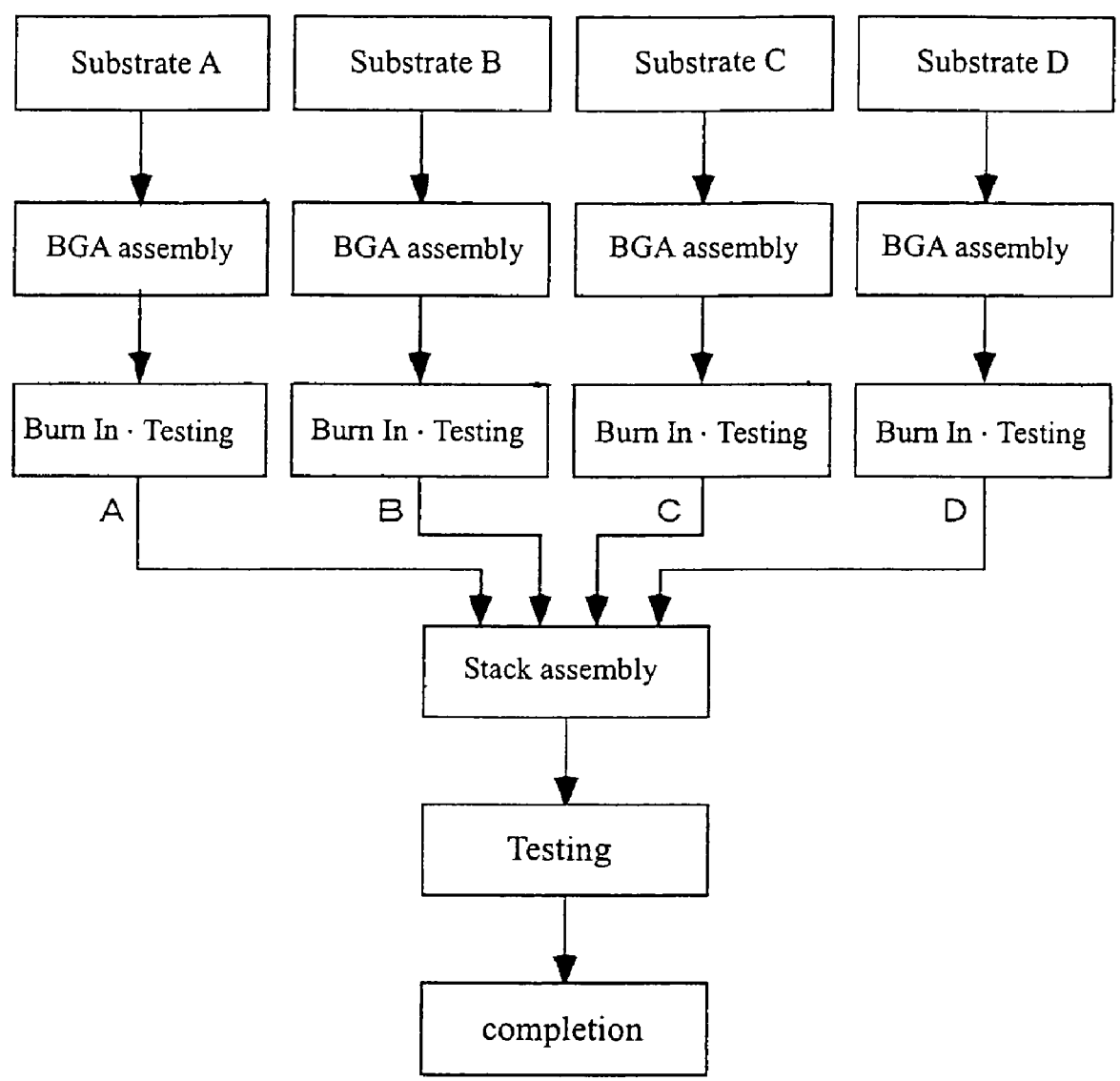
FIG. 5 is a flow diagram for explaining a manufacturing process of a semiconductor device using the tape carrier substrates shown in FIGS. 1 to 4.
Figure 6:
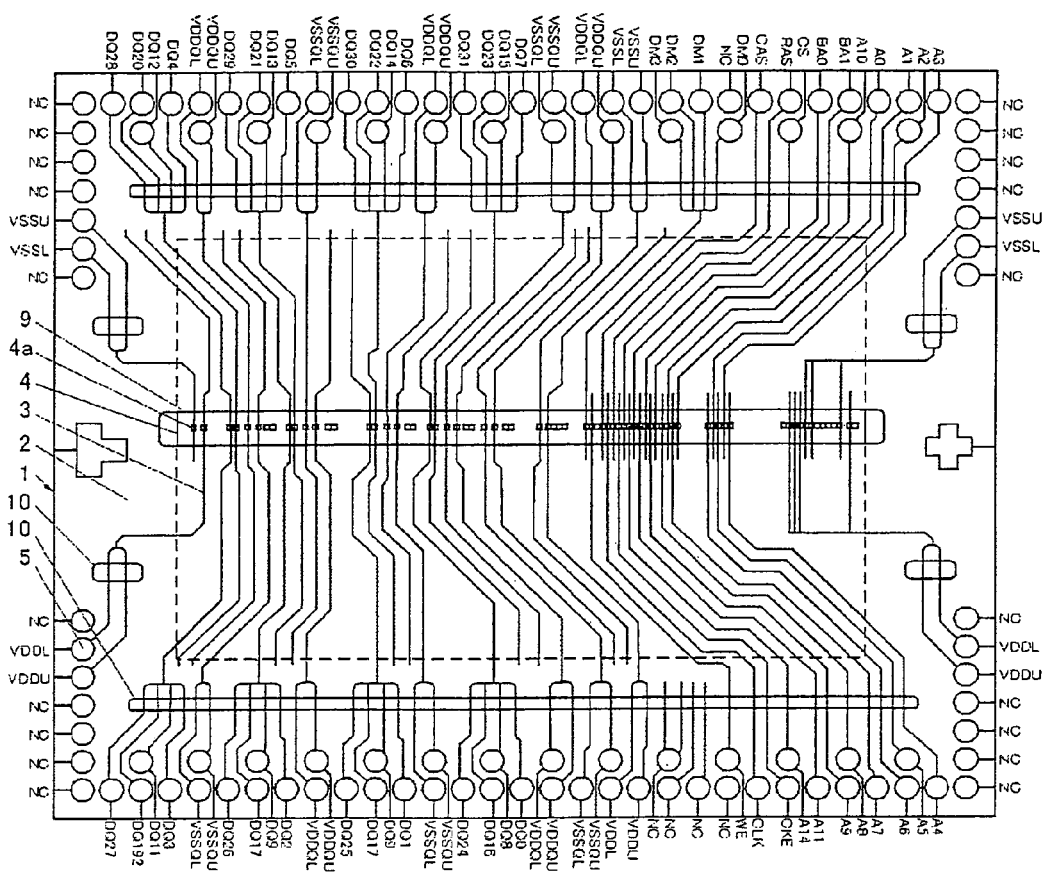
FIG. 6 is a plan view showing a state of mounting a semiconductor chip on a tape carrier substrate used in a semiconductor device according to an embodiment of the present invention.

FIG. 6 is a plan view showing a state of mounting semiconductor chips on tape carrier substrates used in a semiconductor device according to an embodiment of the present invention.

A tape carrier substrate 1 is composed of a film-shaped insulating substrate 2 made of polyimide etc. on which leads 3 each made of a metal film (hereinafter "lead") are formed. One end of each lead 3 is connected to a bonding pad 4a (hereinafter 'pad') of a semiconductor chip 4 and the other end thereof is connected to a connection terminal 5 of the tape carrier substrate 1. The respective tape carrier substrates are connected by bump electrodes 6 formed on the connection terminals 5. The semiconductor chip 4 is fixed to the tape carrier substrate 1 by an adhesive layer 7, and a connecting portion between the lead 3 and the pad 4a is covered with an encapsulation material 8 such as a resin.

This tape carrier substrate is used for the center-pad type semiconductor chip 4 in which the pads 4a are arranged along the central portion of the semiconductor chip, and windows 9 for connecting the semiconductor chip are provided in the central portion of the tape carrier substrate 1 so as to correspond to the pads 4a disposed in the semiconductor chip 4. One ends of the leads 3 are connected to the pads 4a of the semiconductor chip 4 in these windows 9, and the leads 3 extend from the central portion to the peripheral portion of the tape carrier substrate 1, and the other ends of the leads 3 are connected to the connection terminals.

In this tape carrier substrate 1, the lead 3 is branched into some in the vicinity of the connection terminals 5, and the respective branched leads 3 are connected to the different connection terminals 5. The branched leads 3 can be easily trimmed at the windows 10 for trimming, which are provided in the vicinity of the connection terminals 5. Therefore, the tape carrier substrates 1 to be stacked as each layer can be obtained from the tape carrier substrates 1 each having the same lead pattern shown in FIG. 6 by selectively trimming the branched leads 3 thereof. More specifically, it is possible to obtain the substrates having different lead patterns by changing the branched leads to be trimmed.

Figure 7:
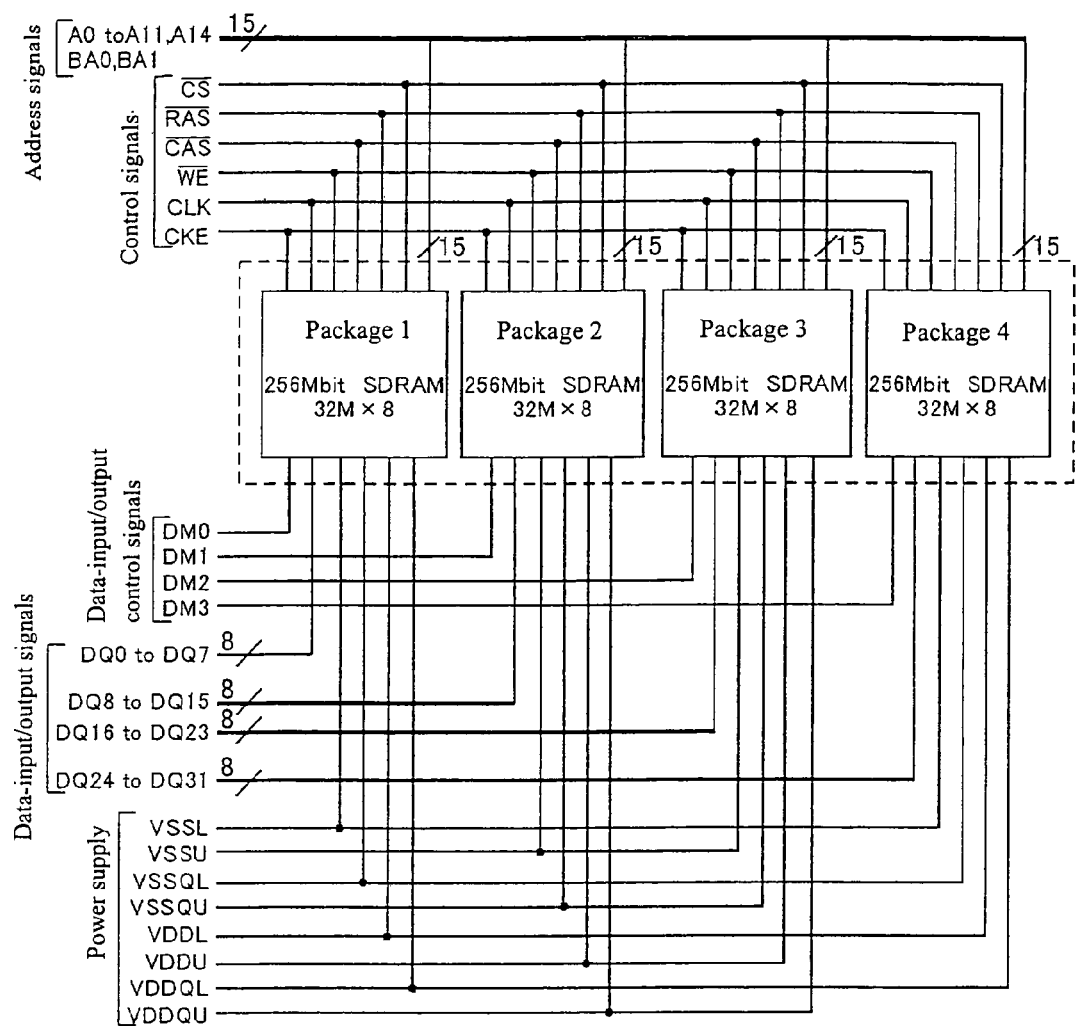
FIG. 7 is a block diagram showing a semiconductor device according to an embodiment of the present invention.
Figure 9:
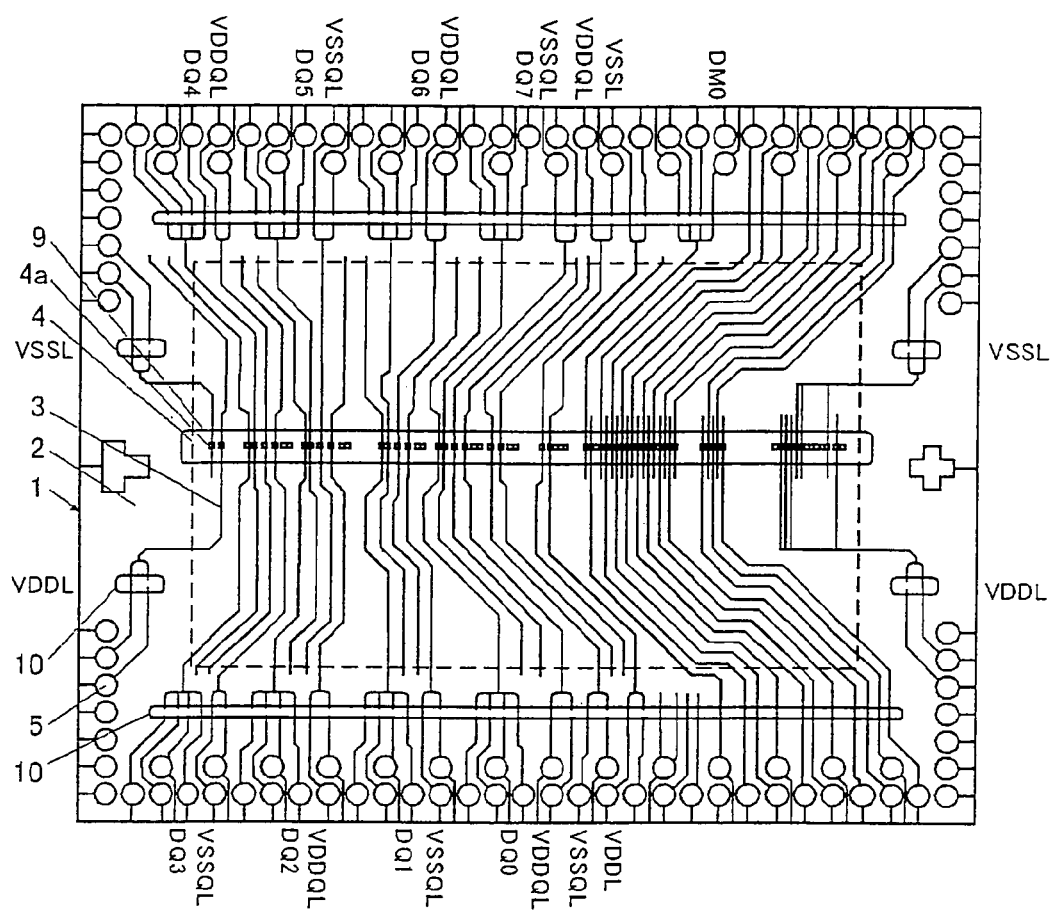
FIG. 9 is a plan view showing a tape carrier substrate for each layer obtained by singulating the tape carrier substrates shown in FIG. 6.
Figure 10:
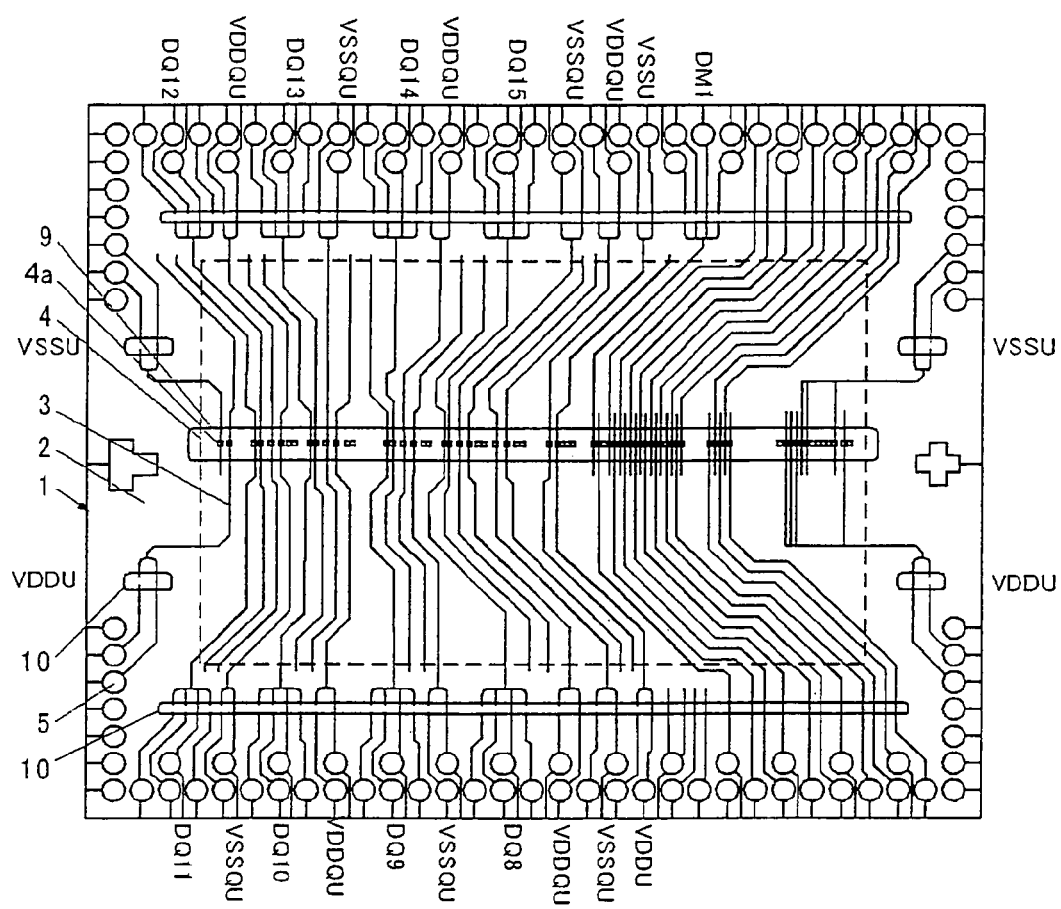
FIG. 10 is a plan view showing a tape carrier substrate for each layer obtained by singluating the tape carrier substrates shown in FIG. 6.
Figure 11:
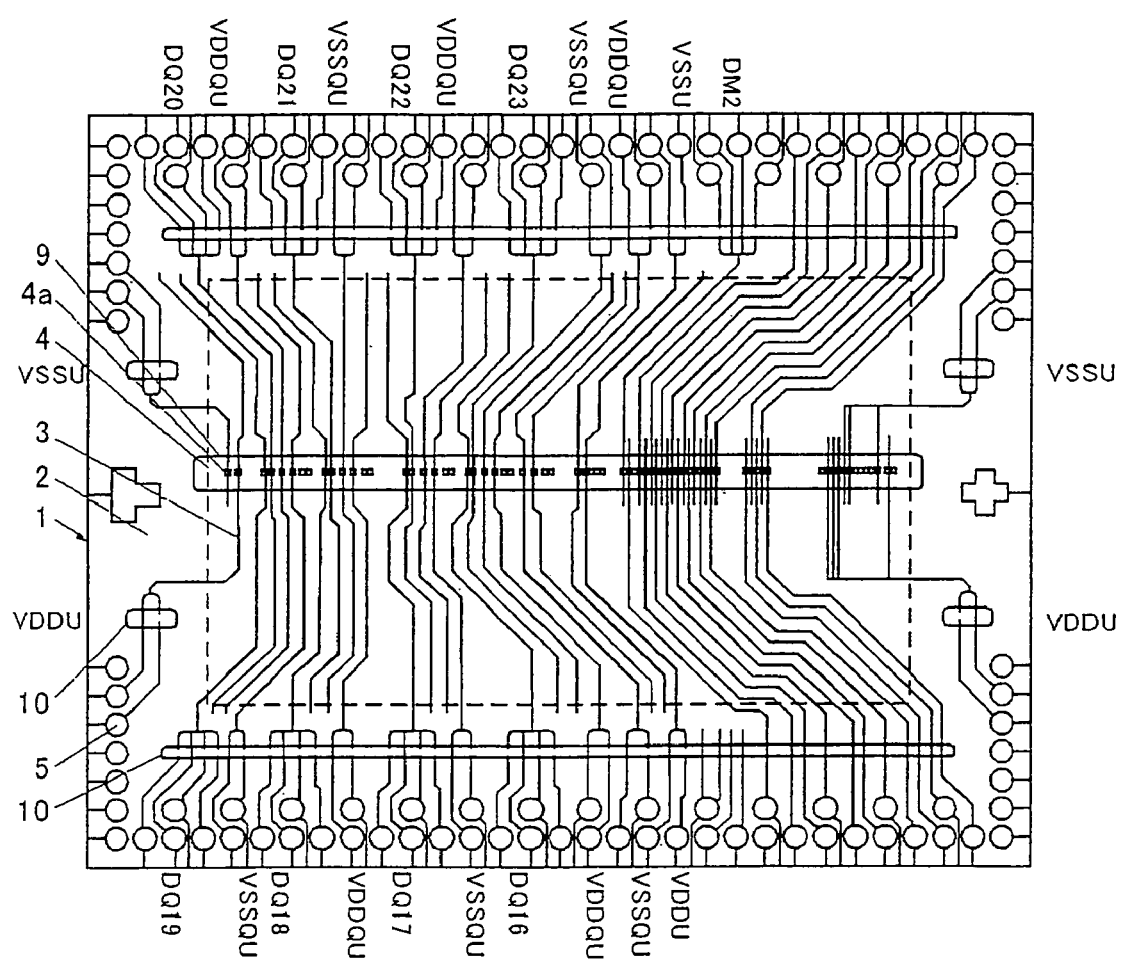
FIG. 11 is a plan view showing a tape carrier substrate for each layer obtained by singluating the tape carrier substrates shown in FIG. 6.
Figure 12:
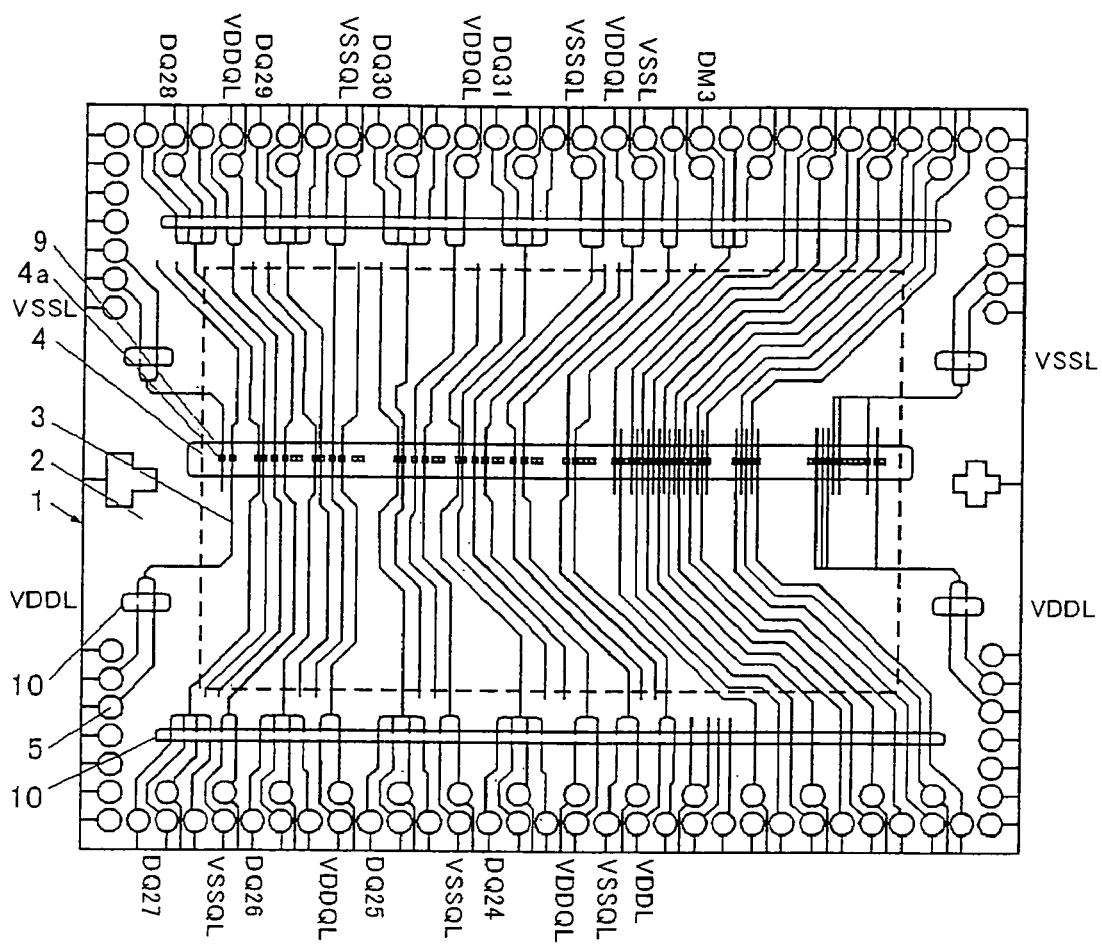
FIG. 12 is a plan view showing a tape carrier substrate for each layer obtained by singulating the tape carrier substrates shown in FIG. 6.

As shown in the block diagram of FIG. 7, in the semiconductor device according to this embodiment, four tape carrier substrates 1 each provided with the semiconductor chip 4 having the same 256-Mbit SDRAM are stacked to form a semiconductor memory device provided with a 32M-word×32-bit system having one back of 1-Gbit SDRAM.

In the connection of the respective stacked semiconductor chips 4, address signal lines (A0 to A11, A14, BA0 and BA1) and control signal linen (CS, RAS, CAS, WE, CLK and CKE) are common to the respective semiconductor chips, and the semiconductor chips 4 are connected in parallel. Therefore, the same patterns can be used as the line patterns of the tape carrier substrates 1.

However, the specific lines used as data-input/output control signal lines (DM0 to DM3) are required in each of the semiconductor chips 4, and 8 data-input/output signal lines (DQ0 to DQ31) are respectively allocated to each of the semiconductor chips 4, that is, a total of 32 lines are provided. Therefore, the data-input/output control signal lines and the data-input/output signal lines require connecting the semiconductor chips 4 to the connection terminals 5 different per semiconductor chip 4 in accordance with the layers to be stacked.

With respect to a power supply line, it is possible to commonly connect each of the semiconductor chips 4 to one set of lines. However, this embodiment provides two sets of power supply lines (VSSL, VSSQL, VDDL, and VDDQL) and (VSSU, VSSQU, VDDU, and VDDQU) in order to reduce the noise, and each two chips is respectively connected to each set of power supply lines. Therefore, the power supply lines require connecting each two semiconductor chips 4 to the respective different connection terminals 5. Note that it is also possible to reinforce the lines by branching the power supply line into four lines and connecting each of the branched lines to each semiconductor chip 4. In addition, it is also possible to reinforce the lines by branching the clock signal line CLK to stabilize the clock signals.

As described above, in the semiconductor device of this embodiment, in order to connect the same pads 4*a* of the respective semiconductor chips 4 to the different connection terminals 5 disposed on the tape carrier substrates 1 to be stacked as each layer, the branched leads 3 at the windows 10 of the tape carrier substrates 1 are selectively trimmed to retain electrical conduction of only the predetermined leads 3. In this manner, the signals are switched.

FIG. 8 shows signals selected by the trimming per package of the semiconductor chips in the example shown in FIG. 7. FIGS. 9 to 12 are plan views each showing the tape carrier substrate 1 for each layer, which is singulated by trimming the leads 3 of the tape carrier substrate 1 shown in FIG. 6, and the selected signals for each of the connection terminal 5 are shown.

For example, with respect to the data-input/output control signal lines and the data-input/output signal lines, the leads 3 branched into four lines are trimmed except each different one line in the tape carrier substrates 1 shown in FIGS. 9 to 12. As a result, the respective connection terminals 5 different per each layer are connected to the same pads 4*a* of the respective semiconductor chips 4. In addition, with respect to the power supply line, one of the leads 3 branched into two lines is trimmed, and consequently the two sets of connection terminals 5 are selected per each layer and connected to the same pads 4*a* of the semiconductor chips 4. In the tape carrier substrate 1 in this embodiment, since the switch of the signals is made in the vicinity of the connection terminals 5 of the tape carrier substrate 1, a sufficient space is provided in the tape carrier substrate and a large number of signals can be switched.

Figure 13:
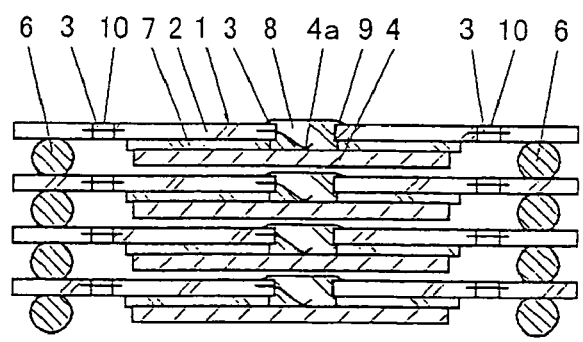
FIG. 13 is a longitudinal sectional view showing a state of stacking the tape carrier substrates each mounting a semiconductor chip.

FIG. 13 is a longitudinal sectional view showing a state of stacking the tape carrier substrates each mounting the semiconductor chips shown in FIGS. 9 to 12.

Figure 14:
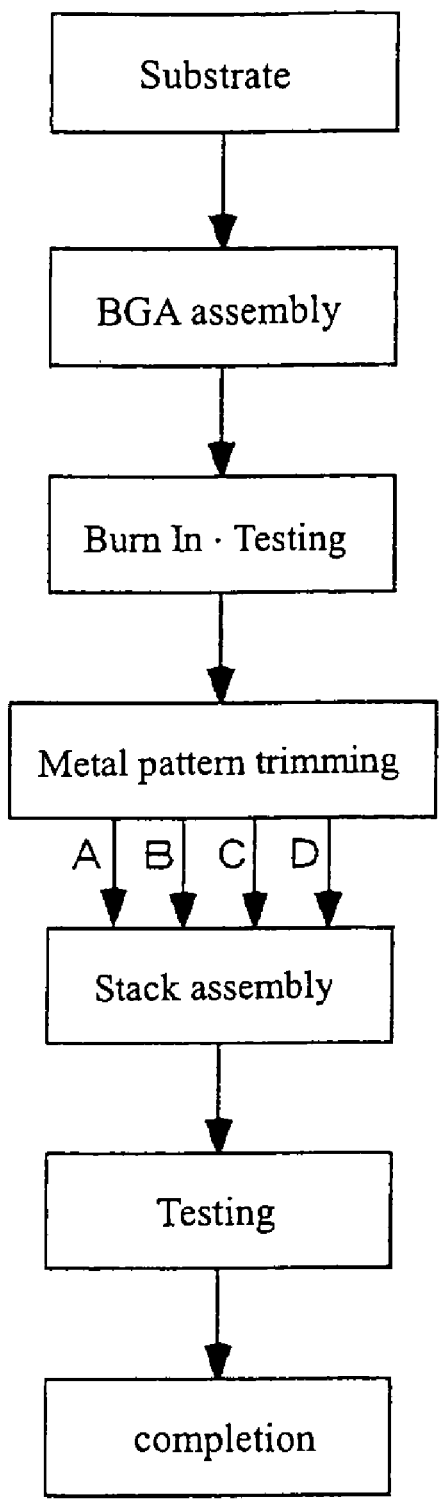
FIG. 14 is a flow diagram for explaining a manufacturing process of a semiconductor device according to an embodiment of the present invention.

Also, in a manufacturing process of the semiconductor device according to this embodiment, as shown in the flow diagram of FIG. 14, a BGA assembly for mounting the semiconductor chips on the tape carrier substrates 1 having the same patterns is first made, and then a burn-in (B/I) testing and a sorting testing are carried out to select good products.

In the manufacture of the semiconductor device according to this embodiment, these testings are carried out to one type of tape carrier substrates 1 before the pattern trimming. Therefore, since the leads 3 formed thereon have the same patterns, the testings for the tape carrier substrates 1 can be carried out by using the same program and by setting the same testing. Consequently, it is possible to simplify the testings and to reduce the time required for the testings.

Subsequently, in this embodiment, the pattern trimming in which the leads 3 are selectively trimmed is carried out to change the circuit patterns, whereby the tape carrier substrates 1 for each layer (A, B, C, and D) are singulated. In this embodiment, since the tape carrier substrates 1 for each layer are singulated after sorting the good products, the case where the number of tape carrier substrates 1 for each layer is insufficient can be prevented and the tape carrier substrates 1 can be efficiently used. In addition, since the windows 10 are provided at positions where the leads 3 are to be trimmed, the leads 3 can be easily and surely trimmed by the use of a small punch or the like.

As shown in FIG. 13, the singulated tape carrier substrates 1 are stacked in predetermined order, and then they are assembled by heating and melting the bump electrodes 6. Thereafter, the sorting testing for the whole semiconductor device is carried out to eliminate defective products, and then the semiconductor device is completed as a product.

Although the singulated tape carrier substrates 1 can be stacked and assembled in a sequence of steps, the singulated tape carrier substrates 1 after trimming the leads 3 thereof may be carried or stored in some cases. In such a case, it is required to easily identify the tape carrier substrates 1 for each layer. For that purpose, indexes capable of easily identifying the tape carrier substrates 1 for each layer are formed during the process of trimming the leads 3.

FIGS. 15 to 18 are partially plan views showing examples of such indexes. The indexes can be provided at such positions that the windows 10 can be formed. However, it is desired that the index is provided at an easy-to-find location such as a corner of the tape carrier substrate 1. As for its arrangement, depending on a trimming state of the specific leads 3 not connected to the semiconductor chip 4, the tape carrier substrates 1 for each layer are identified.

Figure 15:
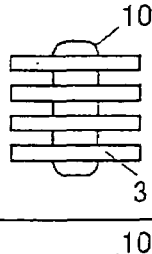
FIG. 15 is a partially plan view showing indexes of the semiconductor device according to an embodiment of the present invention.

In the example show in FIG. 15, four leads 3 are disposed to bridge the same windows 10. Each layer is identified depending on the position of the trimmed lead in the example shown in an upper side of FIG. 15 while each layer is identified depending on the position of the lead not trimmed in the example shown in a lower side of FIG. 15. In this case, the four leads 3 are used to identify the four layers of tape carrier substrates 1. However, it is also possible to identify the four layers of tape carrier substrates 1 by trimming one or both of the two loads 3 or by not trimming one or both thereof, and it is not always necessary to form the same number of leads 3 as that of the layers of the tape carrier substrates 1. The above-mentioned method can be also used to display other information other than the identification of the respective layers.

Figure 16:
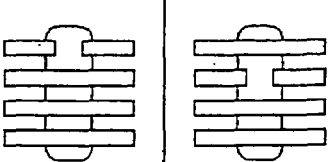
FIG. 16 is a partially plan view showing indexes of the semiconductor device according to an embodiment of the present invention.
Figure 17:
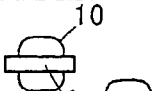
FIG. 17 is a partially plan view showing indexes of the semiconductor device according to an embodiment of the present invention.
Figure 18:
FIG. 18 is a partially plan view showing indexes of the semiconductor device according to an embodiment of the present invention.

FIGS. 16 to 18 show the case where the number of windows is changed from two to four and the similar indexes are formed. In these examples, even if the tape carrier substrate 1 does not have a space for disposing the window 10 which accommodates the four leads 3 in one location, the degree of freedom for places where the indexes are disposed can be enhanced by splitting the windows 10.

Figure 19:
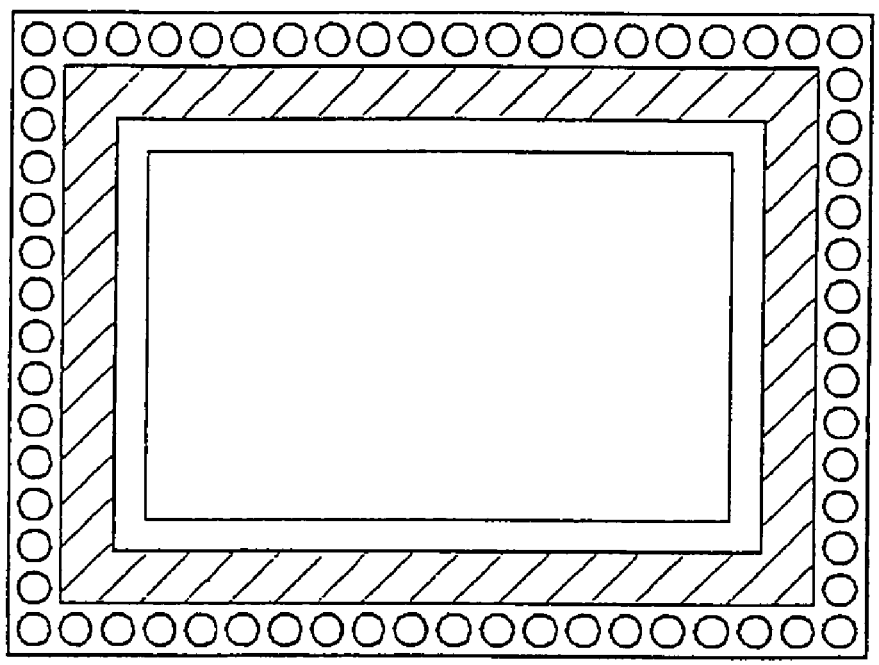
FIG. 19 is a plan view showing an alignment area of trimming portions of the semiconductor device according to an embodiment of the present invention.

Also, portions at which the branched leads 3 are trimmed can be disposed in an area marked with diagonal lines in FIG. 19. However, they are provided in the vicinity of the connection terminals 5 so as to reduce the length of the trimmed branched lines and to enhance the circuit characteristics.

In addition, since the space for disposing the leads 3 to be the predetermined connection terminals 5 is prepared in advance in the vicinity of the connection terminals 5, it is possible to prevent the increase of the space caused due to the branching of the leads 3. Therefore, even if the number of leads 3 which need to switch the signals is increased, it is possible to cope with this increase.

Figure 20:
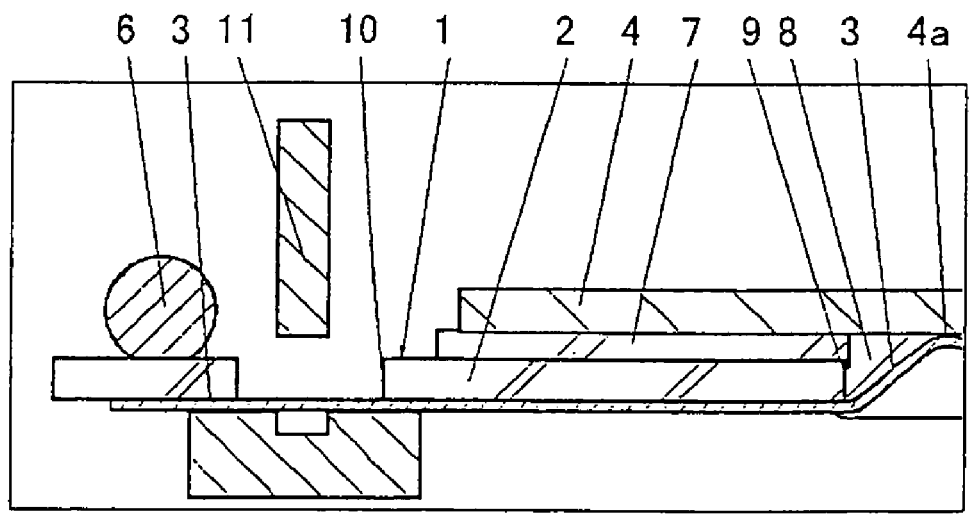
FIG. 20 is a partially enlarged longitudinal sectional view showing the trimming portions of the semiconductor device according to an embodiment of the present invention.

Note that, as shown in FIG. 20, the lead 3 can be easily trimmed by the use of a punch 11. In addition to the punch, for example, a connection tool used for both of the lead connection and the lead trimming can be used to trim the lead 3, and further a trimming tool using heat applied with an ultrasonic wave can be used to melt and trim the lead 3.

Figure 21:
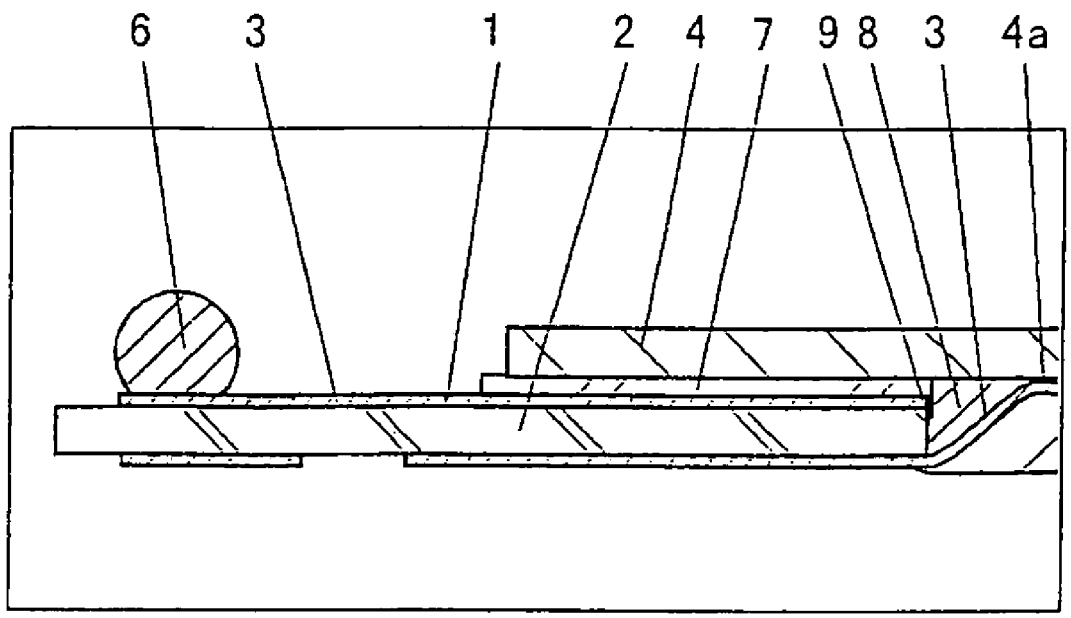
FIG. 21 is a partially enlarged longitudinal sectional view showing a trimming state of a modified example of the semiconductor device according to an embodiment of the present invention.
Figure 22:
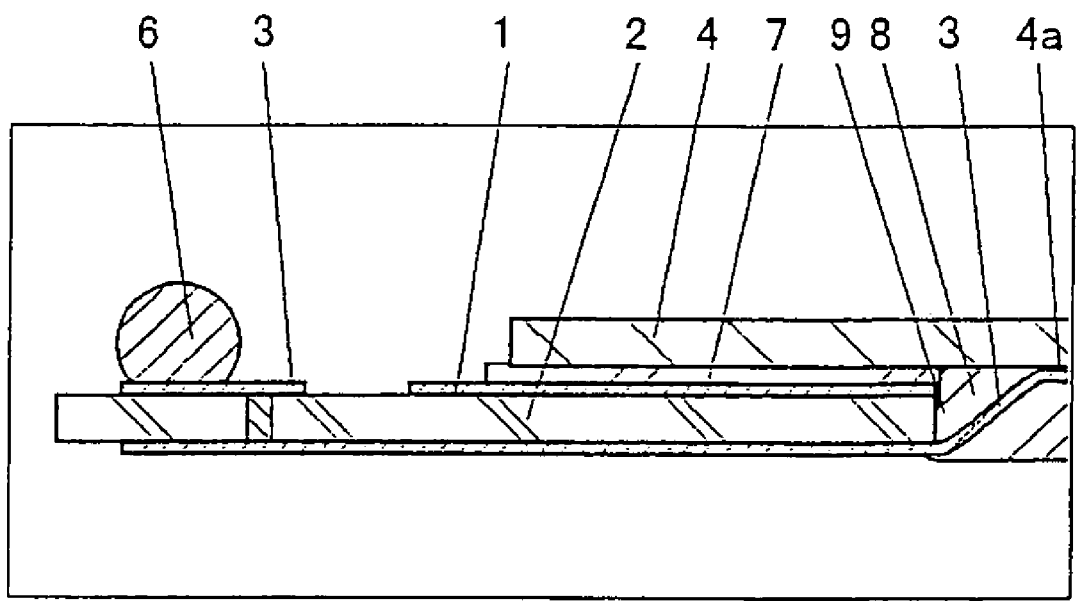
FIG. 22 in a partially enlarged longitudinal sectional view showing a trimming state of a modified example of the semiconductor device according to an embodiment of the present invention.

In addition, it is also possible to collectively remove the leads 3 in a predetermined area by etching. In this case, it is unnecessary to provide the windows 10 in the tape carrier substrate 1, aid the leads 3 can be formed on both surfaces of the substrata 2 of the tape carrier substrate 1 as shown in the partially longitudinal sectional views of FIGS. 21 and 22. In this case, the trimming portions of the leads 3 are the same area as that shown in FIG. 19 if they are a mounting surface of the semiconductor chip 4 as shown in FIG. 21, and the trimming portions of the leads 3 may be an opposite surface to a mounting area of the semiconductor chip 4 if they are the opposite surface to the mounting surface of the semiconductor chip 4 as shown in FIG. 22. Depending on the cases, it is also possible to dispose the trimming portions on both surfaces and to trim sequentially those on one surface and on the opposite surface thereto or simultaneously trim those on both surfaces. In addition, it is also possible to melt and trim the leads 3 by laser irradiation. In this case, however, the windows 10 are not always necessary.

Figure 23:
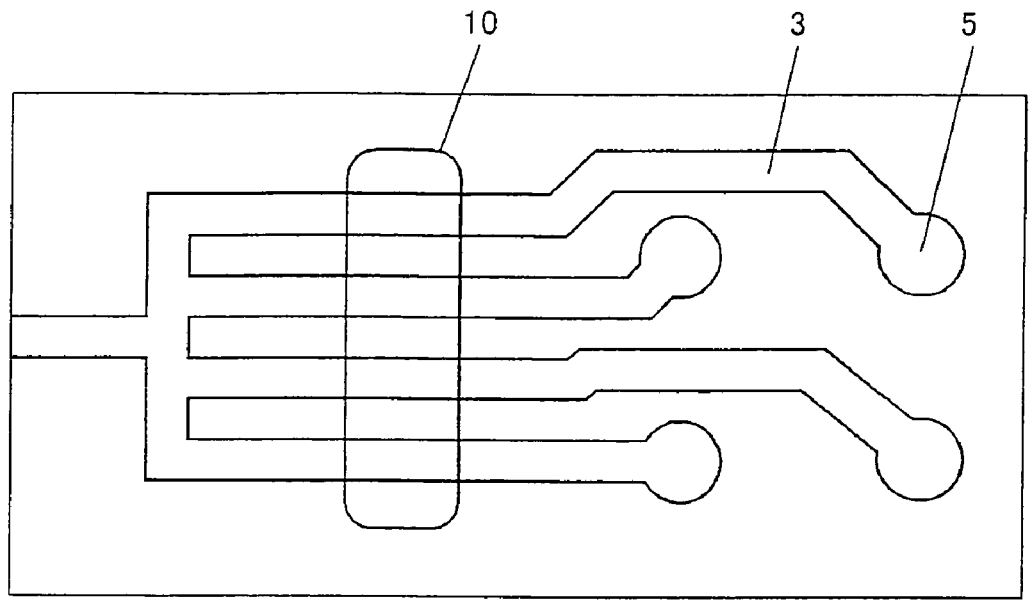
FIG. 23 is a partially enlarged plan view showing a trimming portion of the semiconductor device according to an embodiment of the present invention.
Figure 24:
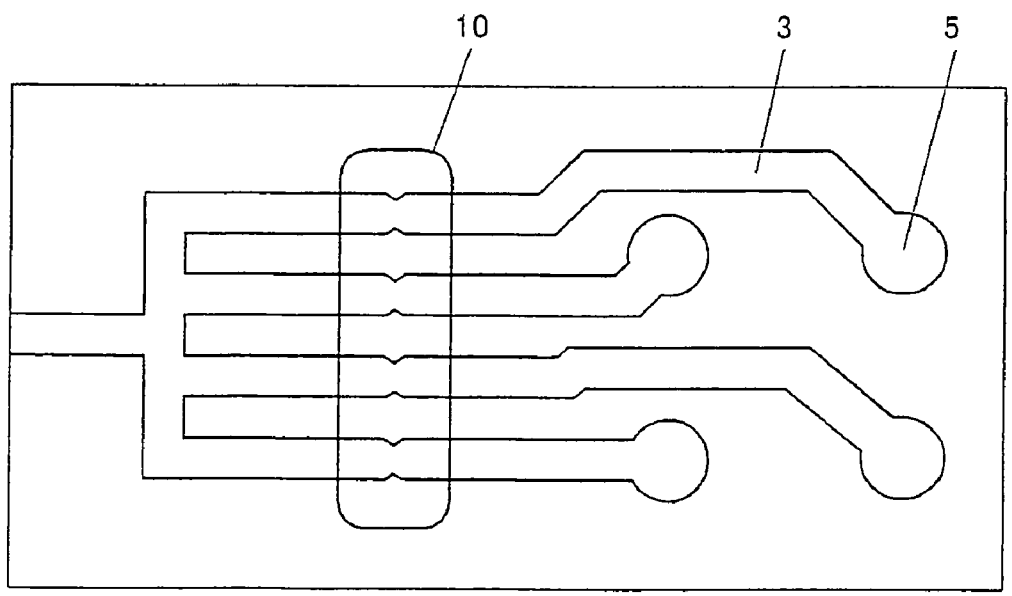
FIG. 24 is a partially enlarged plan view showing a trimming portion of a modified example of the semiconductor device according to an embodiment of the present invention.
Figure 25:
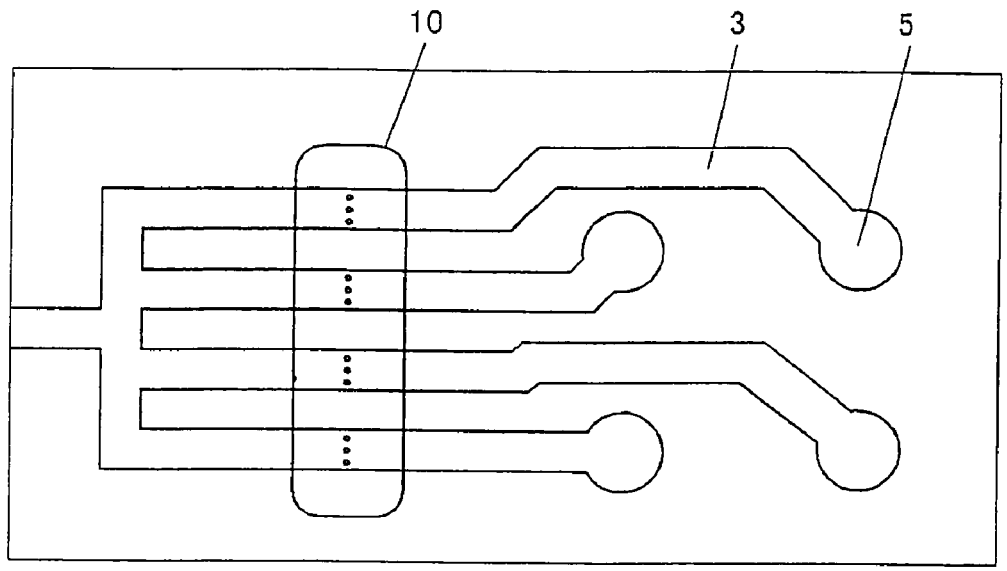
FIG. 25 is a partially enlarged plan view showing a trimming portion of a modified example of the semiconductor device according to an embodiment of the present invention.

FIG. 23 is a partially enlarged plan view showing the trimming portions. As shown in FIG. 23, the trimming portions of the leads 3 are usually formed to have the same width as those of other portions of the leads 3. However, it is also possible to reduce a cross-section area of the trimming portion of each lead a by providing V-shaped notches in the trimming portions as shown in FIG. 24 or by providing a plurality of openings as shown in FIG. 25 to traverse each lead 3 in line. By so doing, the trimming of the leads 3 can be carried out more surely and easily.

Figure 26:
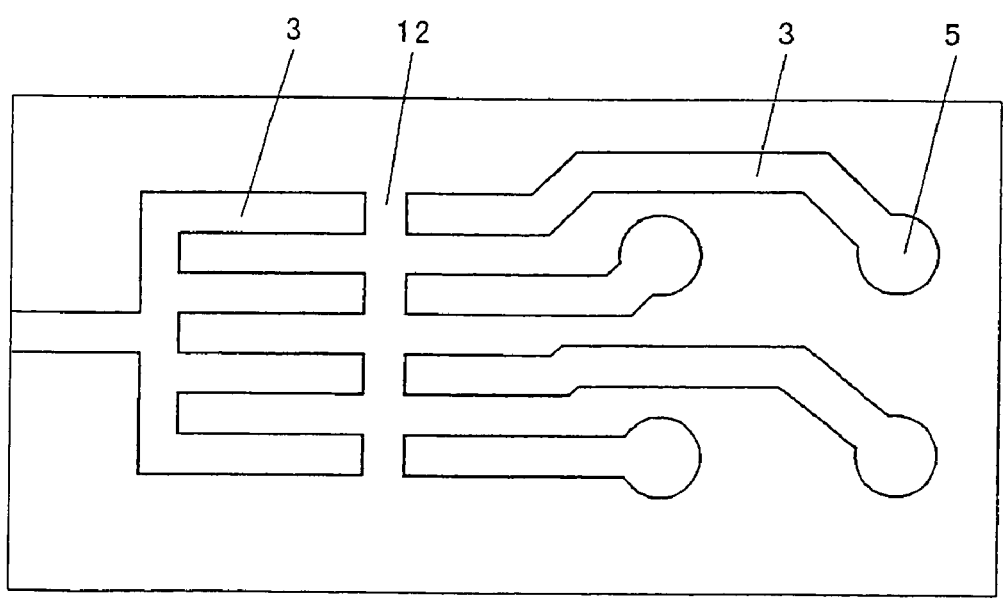
FIG. 26 is a partially enlarged plan view showing a modified example of a trimming portion of the semiconductor device according to an embodiment of the present invention.
Figure 27:
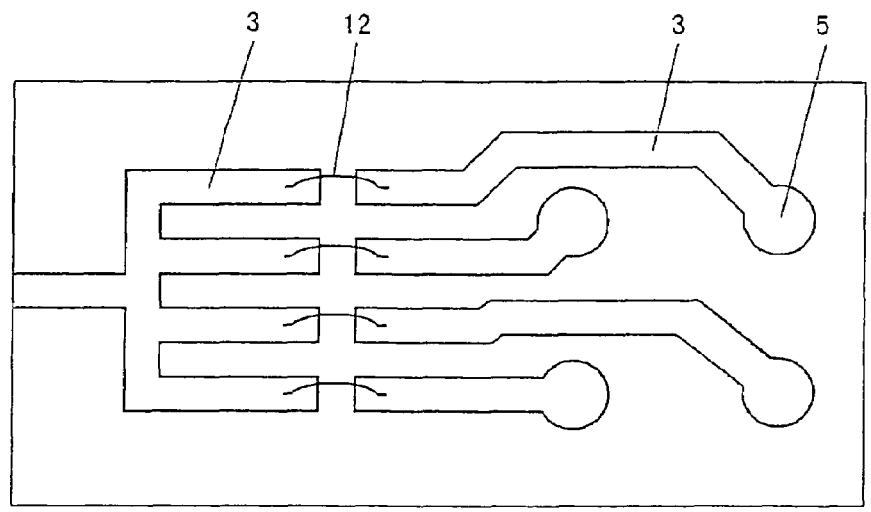
FIG. 27 is a partially enlarged plan view showing a modified example of a trimming portion of the semiconductor device according to an embodiment of the present invention.
Figure 28:
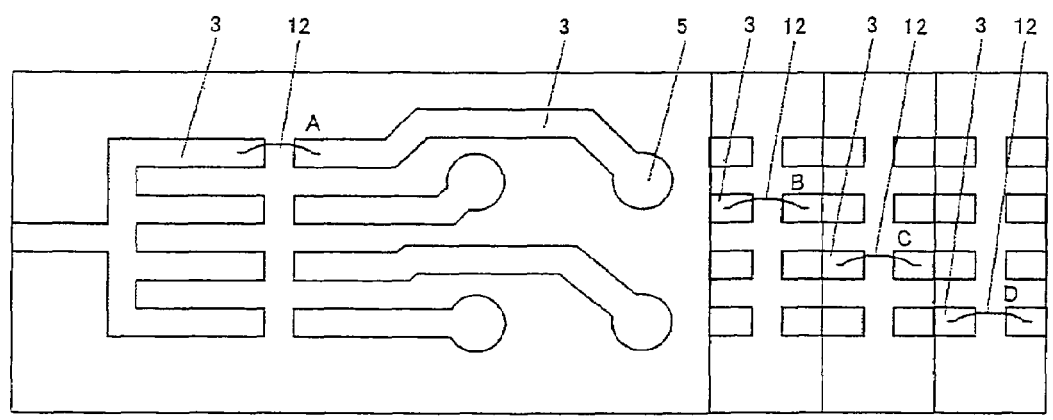
FIG. 28 is a partially enlarged plan view showing a modified example of a trimming portion of the semiconductor device according to an embodiment of the present invention.

In the description above, the tape carrier substrates 1 for each layer are singulated by selectively trimming the leads 3 other than the predetermined lead 3 and maintaining the conduction between the predetermined lead 3 and the branched leads 3. However, the structure as follows is also available. That is, all of the branched leads 3 are formed in a trimmed state in advance, as shown in the partially enlarged plan view of FIG. 26. The trimmed portions are conducted by bonding wires 12, as shown in the partially enlarged plan view of FIG. 27, and, in this state, the sorting testing is carried out. Thereafter, the bonding wires 12 are selectively removed as shown in the partially enlarged plan view of FIG. 28, whereby the tape carrier substrates 1 are singulated for each of the packages A, B, C, and D.

Figure 29:
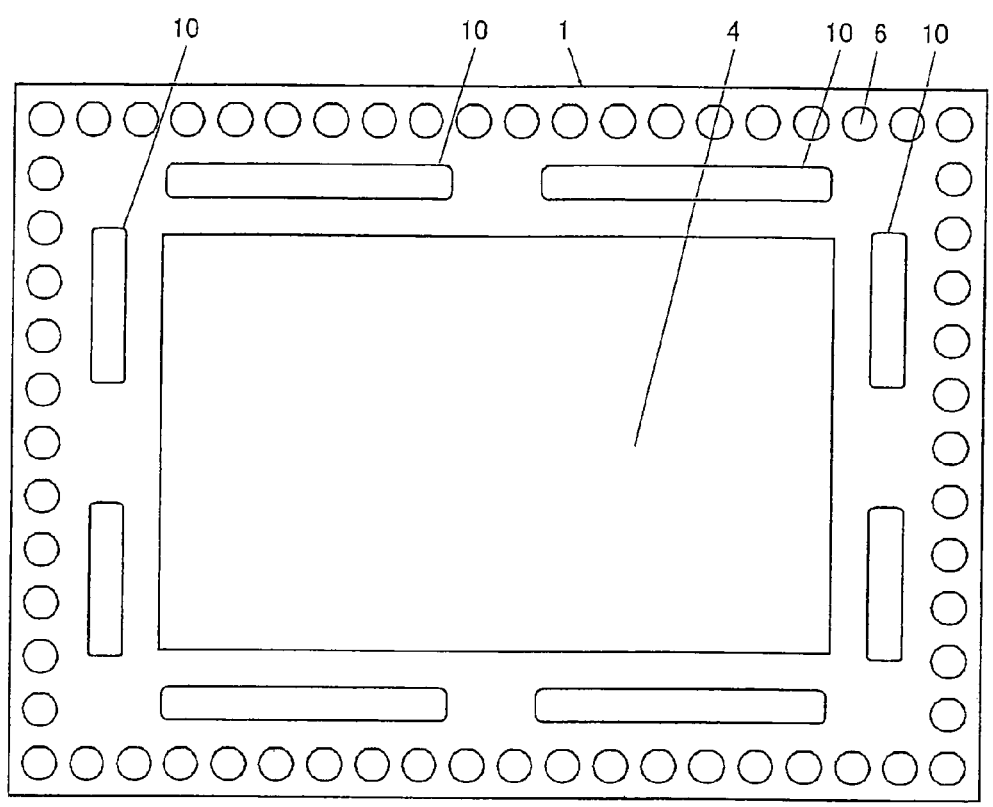
FIG. 29 is a plan view showing an example of changing arrangement of windows of a tape carrier substrate used in the semiconductor device according to an embodiment of the present invention.

Also, in the case where a film-shaped substrate 2 is used as the tape carrier substrate 1, since the tape carrier substrate 1 has flexibility, the tape carrier substrate 1 is easily deformed. For its prevention, the windows 10 are symmetrically arranged in the tape carrier substrate 1 shown in FIG. 6. A force applied to the tape carrier substrate 1 is balanced by this symmetrical arrangement, whereby the deformation of the tape carrier substrate 1 is reduced. Another example of the tape carrier substrate 1 in which the windows 10 are symmetrically arranged is shown in FIG. 29. In this example, the window 10 disposed along a longitudinal side of the substrate 1 is split into two. Therefore, even if the leads 3 to be trimmed are not provided on the symmetrical side, dummy windows 10 are formed on the symmetrical side.

Figure 30:
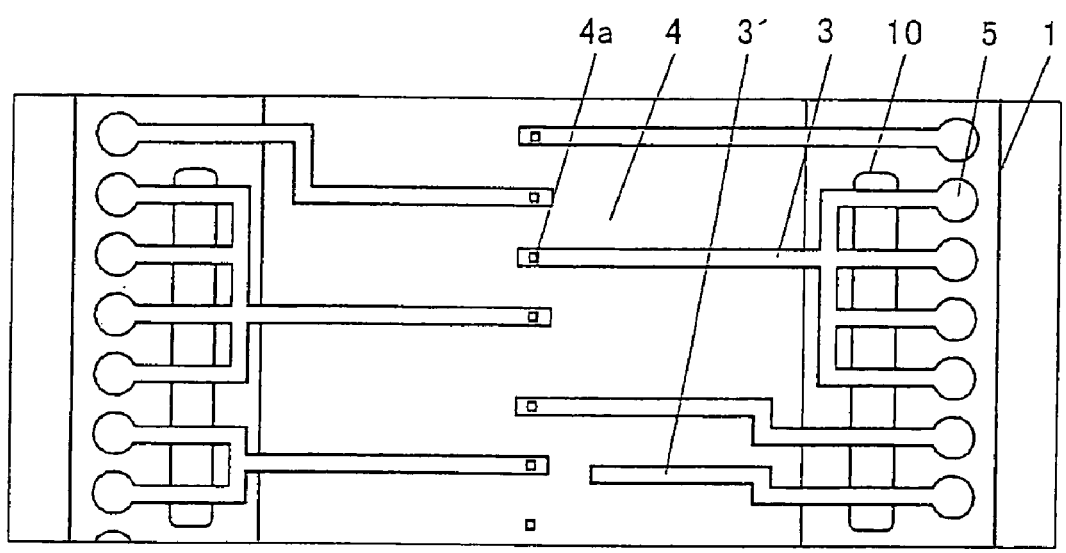
FIG. 30 is a partially enlarged plan view showing a dummy lead in the semiconductor devise according to an embodiment of the present invention.

In the area of the windows 10 mentioned above, it is necessary to balance strength and stress in each package by controlling the number of leads 3 so as to prevent defect in the package such as warp. Therefore, as shown in FIG. 30, dummy leads 3' are disposed even if the connection terminals 5, to which the signals are not allocated and which are not connected to the semiconductor chip 4, do not need the leads 3, whereby it is desired that the number of lines in the windows 10 is equalized. Note that FIG. 30 is, a diagram showing a state before trimming of the leads.

In the foregoing, the case of the semiconductor memory device provided with a 32M-word×32-bit system having one bank of 1-Gbit SDRAM, wherein four layers of the semiconductor chips each having a 256-Mbit SDRAM are stacked, has been described as an example. However, FIG. 31 shows a block diagram showing the case of a semiconductor memory device providing with a 16M-word×32-bit system having two bank of 1-Gbit SDRAMs, wherein four layers of the semiconductor chips each having the 256-Mbit. SDRAM are stacked. FIG. 32 shows signals selected by the switching and each of the leads 3 based on the block diagram.

In connection of each of the stacked semiconductor chips 4, since the address signal lines (A0 to A11, A14, BA0, and BA1) and the control signal lines (RAS, CAS, WE, and CKE) are common to the respective semiconductor chips and the respective semiconductor chips 4 are connected in parallel, the same pattern can be used as the line pattern of each tape carrier substrate 1. However, with respect to the control signal lines (CS and CLK), it is necessary to connect the different sets of control signal lines per two chips.

Alan, the specific lines used as the data-input/output control signal line (DM0 to DM3) are required in each of the semiconductor chips 4, and two sets of 16 data-input/output signal lines (DQ0 to DQ31) are respectively allocated to packages of the semiconductor chips 4, that is, a total of 32 lines are provided. Therefore, the data-input/output control signal lines and the data-input/output signal lines require connecting the semiconductor chips 4 to the connection terminals 5 different per semiconductor chip depending on layers to be stacked.

With respect to the power supply line, it is possible to commonly connect each of the semiconductor chips 4 to one set of lines. However, in this embodiment, two sets of power supply lines (VSSL, VSSQL, VDDL, and VDDQL) and (VSSU, VSSQU, VDDU, and VDDQU) are provided to reduce the noise, and each two chips are connected to each set of power supply lines. Therefore, the power supply lines require connecting the semiconductor chips 4 and the connection terminals 5 different per two chips. Note that it is also possible to reinforce the lines by branching the power supply line into four lines and connecting the different branched lines to the respective semiconductor chips 4.

As described above, even if the SDRAM have the same capacity, the type and number of signals to be selected are different and, for example, the increase of the number of layers to be stacked has been proposed. Also, in addition to the DRAM, the stack of nonvolatile semiconductor memory devices or SRAMs and the stacks of the nonvolatile semiconductor memory devices and the DRAMS nave been also examined. Therefore, it is expected that the number and type of the signals to be selected will be further increased in the stack assembly. However, since the space required for switching the signals is small in the semiconductor device according to this embodiment, it is possible to easily cope with such a case.

(Second Embodiment)

Figure 33:
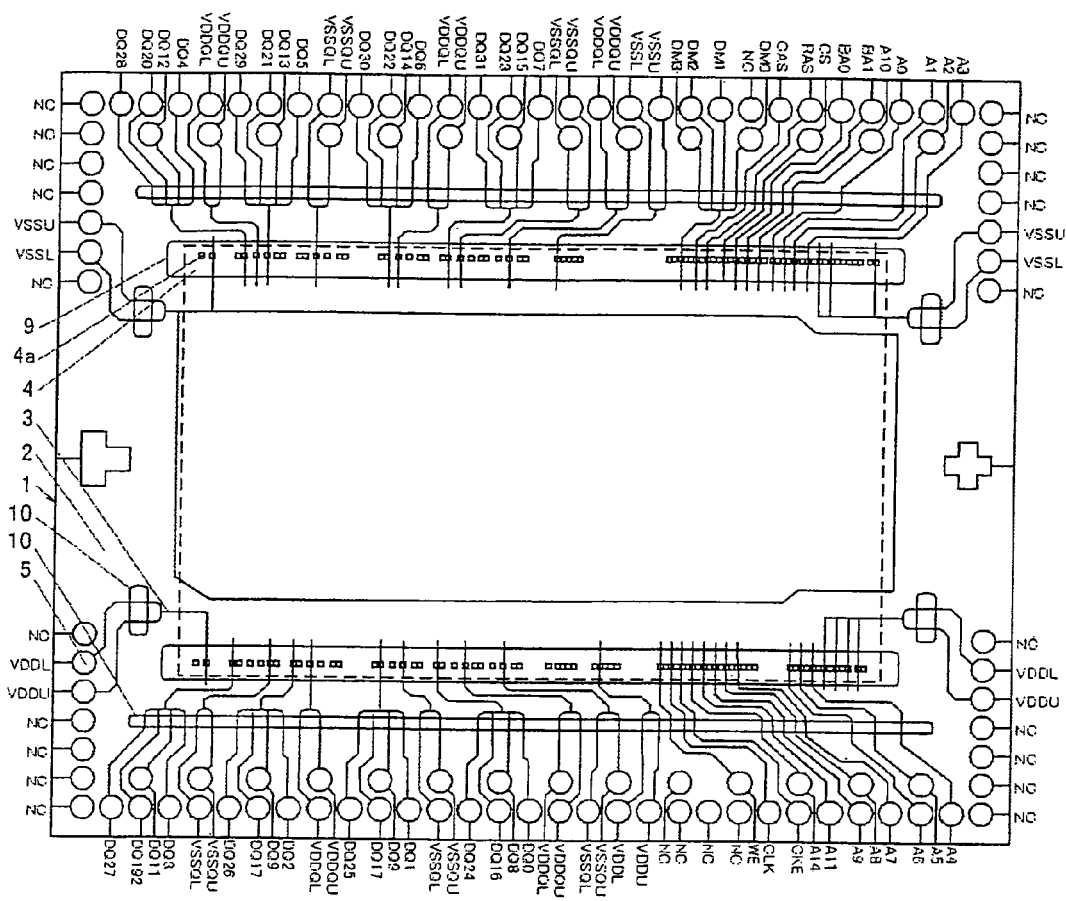
FIG. 33 is a plan view of a structure before trimming of leads, in a state of mounting a semiconductor chip on a tape carrier substrate used in a semiconductor device according to another embodiment of the present invention.
Figure 34:
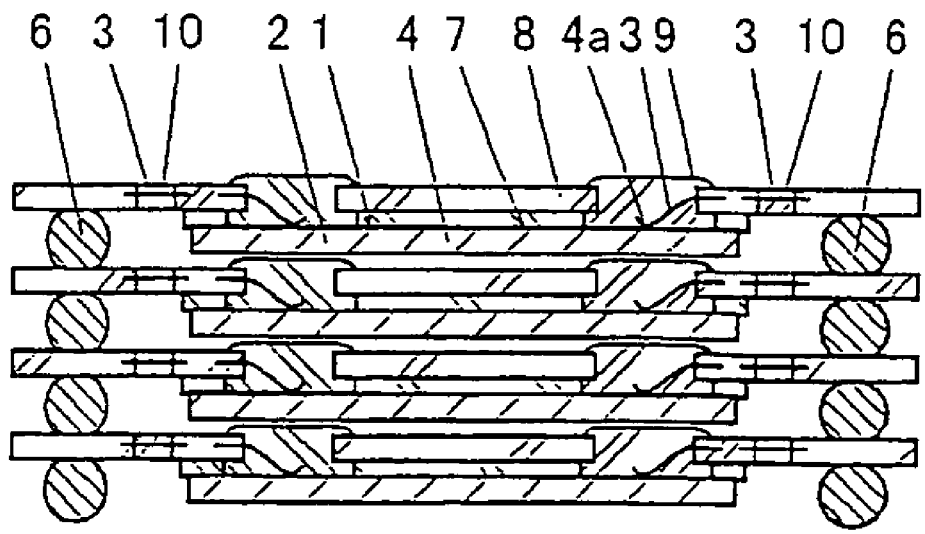
FIG. 34 is a longitudinal sectional view showing a state of mounting a semiconductor chip and of stacking the tape carrier substrates after trimming of leads.

FIG. 33 is a plan view showing a structure before trimming of leads, in a state of mounting the semiconductor chip on the tape carrier substrate used in a semiconductor device according to another embodiment of the present invention. FIG. 34 is a longitudinal sectional view showing a state of mounting semiconductor chips and stacking tape carrier substrates after trimming of leads. The tape carrier substrate of this embodiment is different from that of the first embodiment in that this embodiment is used for the corner-pad type semiconductor chip 4, at the peripheral portions of which the bonding pads 4a (hereinafter "pad") are disposed.

The tape carrier substrate 1 is composed of a film-shaped insulating substrate 2 made of polyimide etc. on which leads 3 each made of a metal film (hereinafter "lead") are formed.

One ends of the leads 3 are connected to the pads 4a of the semiconductor chip 4 and the other ends thereof are connected to the connection terminals 5 of the tape carrier substrate 1. The tape carrier substrates are connected to each other by the bump electrodes 6 formed on the connection terminals 5. The semiconductor chip 4 is fixed to the tape carrier substrate 1 by the adhesive layer 7, and the connecting portions between the leads 3 and the pads 4a are covered with the encapsulation material 8 such as a resin.

The windows 9 for connecting the semiconductor chip are provided at locations corresponding to the pads 4a of the semiconductor chip 4 on the tape carrier substrate 1. One ends of the leads 3 are connected to the pads 4a of the semiconductor chip 4 at these windows 9, and the leads 3 extend from here to the peripheral portion of the tape carrier substrate 1, and the other ends of the leads 3 are connected to the connection terminals.

In this tape carrier substrate 1, the lead 3 is branched to some in the vicinity of the connection terminals 5, and each of the branched leads 3 is connected to each connection terminal 5. The branched leads 3 can be easily trimmed in the windows 10 for trimming, which are provided in the vicinity of the connection terminals 5. Therefore, the tape carrier substrate 1 to be stacked as each layer can be obtained from the same tape carrier substrate 1 by selectively trimming the branched leads 3 thereof.

Figure 35:
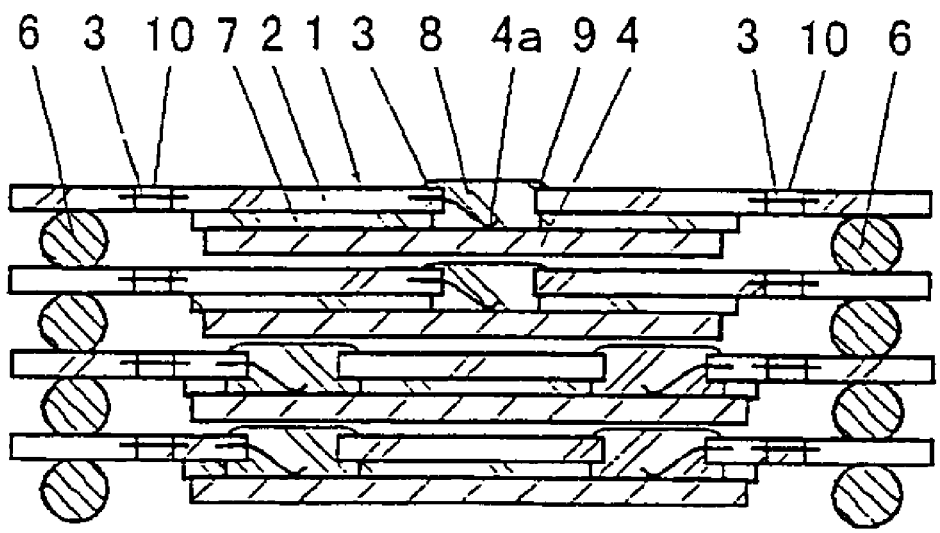
FIG. 35 is a longitudinal sectional view showing a state of stacking the tape carrier substrates each mounting a semiconductor chip.

As described above, the present invention can be applied to the stack of the corner-pad typo semiconductor chips 4. In addition, it is also possible to stack the center-pad type semiconductor chips and the corner-pad type semiconductor chips as shown in FIG. 35.

In the foregoing, the invention made by the inventors of the present invention has been concretely described based on the embodiments. However, needless to say, the present invention is not limited to the foregoing embodiments and can be variously modified and altered without deporting from the gist thereof.

For example, a flexible tape carrier substrate is used as an example in the description of the present invention above. In the present invention, however, an inflexible substrate, such as a substrate obtained by forming leads each made of a metal film on an insulating substrate made of an epoxy resin containing glass fiber, can be used as a substrate for mounting the semiconductor chip. Also, in the examples described above, the other ends of the leads each made of a metal film serve as the connection terminals of the substrate. However, it is also possible to form a structure in which the connection terminals of the substrate are formed separately from the leads and the leads each made of a metal film are connected to these connection terminals.

What is claimed is:

1. A semiconductor device comprising:
   stacked layers of the substrates each formed with insulating material and having a plurality of leads and a plurality of connection terminals, said connection terminals being disposed at the peripheral edges of the substrates;
   semiconductor chips mounted on said substrates, respectively; and
   connection means electrically interconnecting said substrates via the corresponding connection terminals,
   wherein one ends of said plurality of leads are connected to corresponding electrodes formed on said semiconductor chips and the other ends of said plurality of leads extend to the corresponding connection terminals, respectively on each of said substrates;
   wherein said plurality of leads includes a first group in which the other ends of the leads are permanently connected to the corresponding connection terminals, respectively, and a second group in which the other ends of the leads are branched to plural lines in the vicinity of the corresponding connection terminals, respectively;
   wherein on one of said substrates one of the branched lines is connected to the corresponding connection terminal at least at one of the branches, and another of the branched lines is finally trimmed and not connected to the corresponding connection terminal at least at said one of the branches on the same said substrate,
   wherein on another of said substrates one of the branched lines corresponding to said one of the branched lines on said one of the substrates is finally trimmed and not connected to the corresponding connection terminal at least at one of the branches, and another of the branched lines is permanently connected to the corresponding connection terminal at said branch, and
   wherein said connection means includes:
   first leads commonly connected to the connection terminals at said first group on all of the stacked layers of said plurality of substrates;
   second leads commonly connected to some of the connection terminals at said second group on predetermined ones of the layers of said plurality of substrates, the second leads not connected to said plurality of leads on the other layers; and
   third leads connected to the corresponding connection terminals at said second group, respectively, so as to serve as independent signal lines with respect to the corresponding layers of the said plurality of substrates.

2. A semiconductor device comprising:
   stacked layers of substrates each formed with insulating material and having a plurality of leads and a plurality of connection terminals, said connection terminals being disposed at the peripheral edges of the substrates;
   semiconductor chips mounted on said substrates, respectively; and
   connection means electrically interconnecting said substrates via the corresponding connection terminals,
   wherein one ends of said plurality of leads are connected to corresponding electrodes formed on said semiconductor chips the and other ends of said plurality of leads extend to the corresponding connection terminals, respectively on each of said substrates;
   wherein said plurality of leads includes a first group in which the other ends of the leads are permanently connected to the corresponding connection terminals, respectively, and a second group in which the other ends of the leads are branched to plural lines in the vicinity of the corresponding connection terminals, respectively;
   wherein on one of said substrates one of the branched lines is connected to the corresponding connection terminal at least at one of the branches, and another of the branched lines is finally trimmed and not connected to the corresponding connection terminal at least at said one of the branches on the same said substrate, and
   wherein on another of said substrates one of the branched lines corresponding to said one of the branched lines on said one of the substrates is finally trimmed and not connected to the corresponding connection terminal at least at one of the branches, and another of the branched lines is permanently connected to the corresponding connection terminal at said branch, and wherein each of said substrates is provided with a window in the vicinity of said connection terminals at each of said trimmed branches so that the branched line connected to the corresponding connection terminal traverses the windows.

3. The semiconductor device according to claim 2, wherein said windows are symmetrically disposed with respect to each of the substrates.

4. The semiconductor device according to claim 2, wherein a dummy lead is disposed around each of said windows so as to equalize the number of leads on said windows.

5. The semiconductor device according to claim 3, wherein a cross-section area of a trimming portion of each of the leads to be trimmed by said windows is smaller than that of other portion.

6. A semiconductor device comprising:
stacked layers of insulating substrates formed of film-shaped insulating materials; semiconductor chips mounted on said substrates, respectively,
wherein each of said substrates is formed with a plurality of leads and connection terminals, said plurality of leads being connected at their one ends to corresponding electrodes formed on said semiconductor chips, the other ends of said plurality of leads extending to the corresponding connection terminals,
wherein said plurality of leads includes a first group in which each of the leads is permanently connected at the other ends to the corresponding connection terminal and a second group in which each of the leads is branched to plural lines in the vicinity of the connection terminals,
wherein said insulating substrates are formed with substantially the same layout patterns in said plurality of leads and in said connection terminals but different at the branches in said second group in that on one of the substrates, one of the branched lines is connected to the corresponding connection terminal and another of the branched lines is permanently disconnected to the corresponding connection terminal at least at one of the branches; and on another of said substrates, one of the branched lines corresponding to said one of the branched lines on said one of the substrates is permanently disconnected to the corresponding connection terminal at least at the branch corresponding to said one branch on said one of the substrates and another branched line is connected to the corresponding connection terminal at said branch,
wherein said stacked substrates are electrically interconnected via the connection means that connects the corresponding connection terminals so as to serve as common signal lines to said semiconductor chips via the leads in said first group and so as to serve as independent connection lines to particular semiconductor chips via the leads in said second group, respectively.

7. A semiconductor device according to claim 6, in which each of said substrates is a tape carrier substrate obtained by forming a lead made of a metal film on a film-shaped insulating substrate made of polyimide.

8. A semiconductor device according to claim 6, in which each of said substrates is a substrate obtained by forming a lead made of a metal film on an insulating substrate made of an epoxy resin containing glass fiber.

9. A semiconductor device according to claim 6, in which the same semiconductor chip is mounted on each of said plurality of substrates.

10. A semiconductor device according to claim 6, in which said semiconductor chip is a DRAM, and the leads branching into two or more are a data-input/output signal line and a data-input/output signal line.

11. A semiconductor device according to claim 6, in which several sets of power supply lines of said leads are provided in parallel.

12. The semiconductor device according to claim 11, wherein trimming of said leads is used as an index of each of the tape carrier substrates.

13. A stacked assembly of semiconductor chips comprising:
stacked layers of insulating substrates formed of rectangular film-shaped insulating materials;
semiconductor chips mounted on said substrates, respectively, said semiconductor chips being formed substantially the same in the layout patterns and in function; and
connection means electrically interconnecting said substrates,
wherein each of said substrates is formed with a plurality of leads and connection terminals, which terminals are disposed along the peripheral edges of the rectangular substrate, said plurality of leads being connected at their one ends to corresponding electrodes formed on said semiconductor chips and the other ends of said plurality of leads extending to the corresponding connection terminals,
wherein said plurality of leads includes a first group in which each of the leads is permanently connected to the corresponding connection terminal and a second group in which each of the leads is branched to plural lines in the vicinity of the connection terminals,
wherein said insulating substrates are formed with substantially the identical layout patterns in said plurality of leads and in said connection terminals but different at the branches in said second group in that on one of the substrates, one of the branched lines is permanently connected to the corresponding connection terminal and another of the branched lines is permanently disconnected to the corresponding connection terminal at least at one of the branches; and on another of said substrates, one of the branched lines corresponding to said one of the branched lines on said one of the substrates is permanently disconnected to the corresponding connection terminal at least at the branch corresponding to said one branch on said one of the substrates and another branched line is permanently connected to the corresponding connection terminal at said branch,
wherein said stacked substrates are electrically interconnected via the connection means that connect the corresponding connection terminals so that, in operation, said stacked semiconductor chips are supplied with common signals at the electrodes connected to the leads in said first group and with signals different from one another at the electrodes connected to the leads in said second group.

14. A stacked assembly of claim 13, wherein said branches include a two line branch and a four line branch.

15. A stacked assembly of claim 13, wherein grooves are formed to said substrates at the branches so that the branched lead lines bridge the grooves, respectively, and the lead lines are permanently cut off at the portions to be permanently disconnected.

* * * * *